(12) United States Patent
Lin et al.

(10) Patent No.: US 11,063,041 B2
(45) Date of Patent: Jul. 13, 2021

(54) INTEGRATED CIRCUIT DEVICE INCLUDING A POWER SUPPLY LINE AND METHOD OF FORMING THE SAME

(71) Applicant: Taiwan Semiconductor Manufacturing Co., Ltd., Hsinchu (TW)

(72) Inventors: Yi-Hsiung Lin, Hsinchu County (TW); Shang-Wen Chang, Hsinchu County (TW); Yi-Hsun Chiu, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 12 days.

(21) Appl. No.: 16/583,438

(22) Filed: Sep. 26, 2019

(65) Prior Publication Data
US 2020/0135724 A1    Apr. 30, 2020

Related U.S. Application Data

(60) Provisional application No. 62/753,728, filed on Oct. 31, 2018.

(51) Int. Cl.
*H01L 27/088* (2006.01)
*H01L 27/02* (2006.01)
*H01L 21/8234* (2006.01)
*H01L 23/50* (2006.01)

(52) U.S. Cl.
CPC .. *H01L 27/0886* (2013.01); *H01L 21/823431* (2013.01); *H01L 21/823475* (2013.01); *H01L 23/50* (2013.01); *H01L 27/0207* (2013.01)

(58) Field of Classification Search
None
See application file for complete search history.

(56) References Cited

U.S. PATENT DOCUMENTS

| | | | |
|---|---|---|---|
| 9,466,570 B1 * | 10/2016 | Cheng | H01L 23/5283 |
| 10,109,646 B1 * | 10/2018 | Badaroglu | H01L 27/0924 |
| 2017/0352625 A1 * | 12/2017 | Leobandung | H01L 27/1203 |
| 2019/0035785 A1 * | 1/2019 | Ching | H01L 21/823481 |
| 2019/0080969 A1 * | 3/2019 | Tsao | H01L 21/823475 |
| 2020/0135578 A1 | 4/2020 | Ching | |

\* cited by examiner

*Primary Examiner* — Michelle Mandala
(74) *Attorney, Agent, or Firm* — Haynes and Boone, LLP

(57) ABSTRACT

A device includes a first semiconductor strip and a second semiconductor strip extending longitudinally in a first direction, where the first semiconductor strip and the second semiconductor strip are spaced apart from each other in a second direction. The device also includes a power supply line located between the first semiconductor strip and the second semiconductor strip. A top surface of the power supply line is recessed in comparison to a top surface of the first semiconductor strip. A source feature is disposed on a source region of the first semiconductor strip, and a source contact electrically couples the source feature to the power supply line. The source contact includes a lateral portion contacting a top surface of the source feature, and a vertical portion extending along a sidewall of the source feature towards the power supply line to physically contact the power supply line.

20 Claims, 24 Drawing Sheets

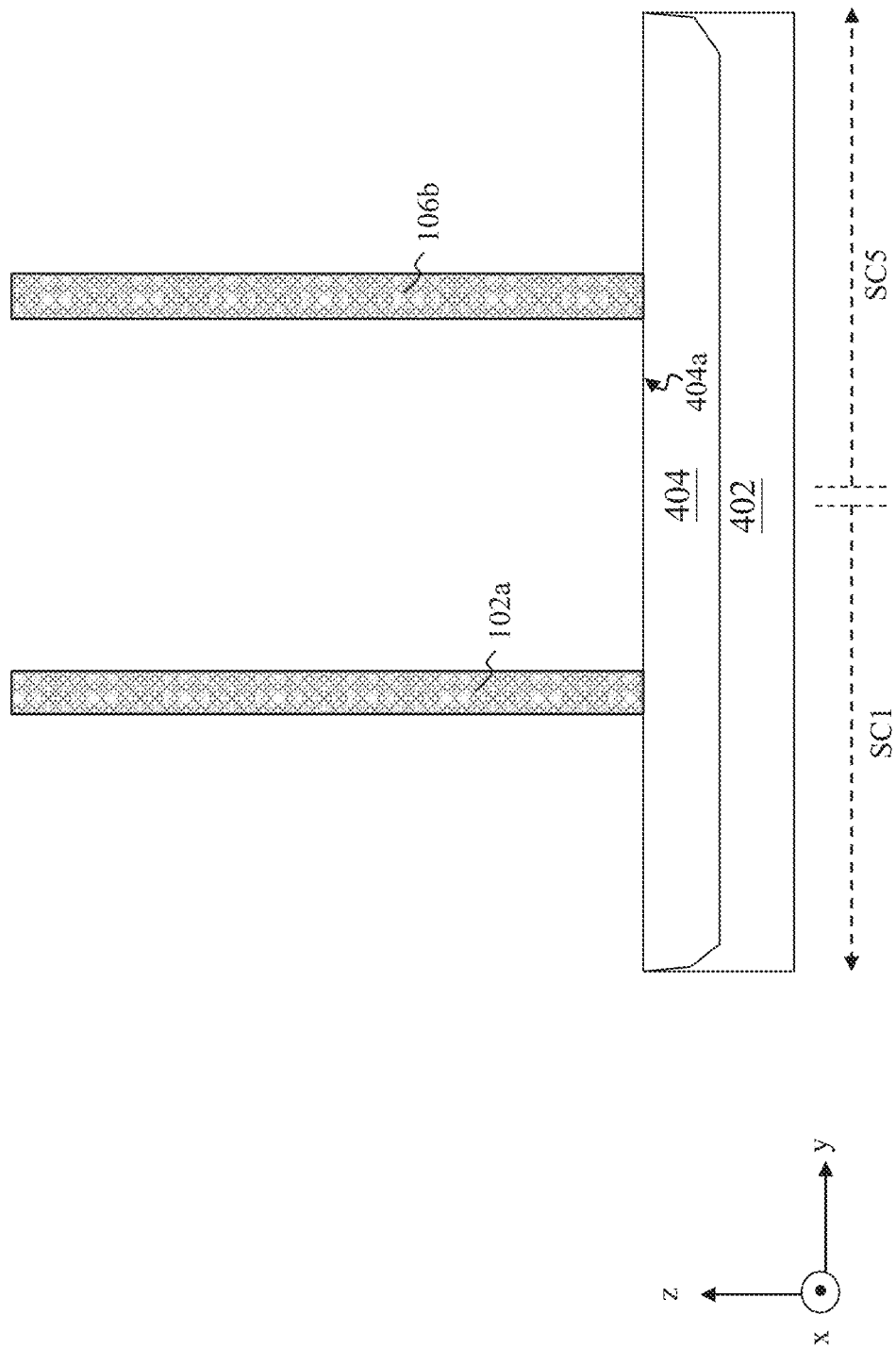

INTEGRATED CIRCUIT DEVICE INCLUDING A POWER SUPPLY LINE AND METHOD OF FORMING THE SAME

CROSS-REFERENCE TO RELATED APPLICATION

This application is a non-provisional application of and claims benefit of U.S. Provisional Patent Application Ser. No. 62/753,728, filed Oct. 31, 2018, the entire disclosure of which is incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component, or line, that can be created using a fabrication process) has decreased.

Despite advances in materials and fabrication techniques, scaling of transistor devices, such as metal-oxide-semiconductor field effect transistor (MOSFET) devices, has proven challenging. For example, although resulting in greater integration and more efficient use of chip real estate, a reduction in feature size can result in increased contact resistance and capacitance. Additionally, process window requirements and critical dimension requirements can become more constrained as more transistor devices are integrated into a unit chip area. This, in turn, can lead to an increase in the complexity of manufacturing processes used to form integrated circuit devices. Improvements in integrated circuit devices and the methods used to manufacture them may be needed.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
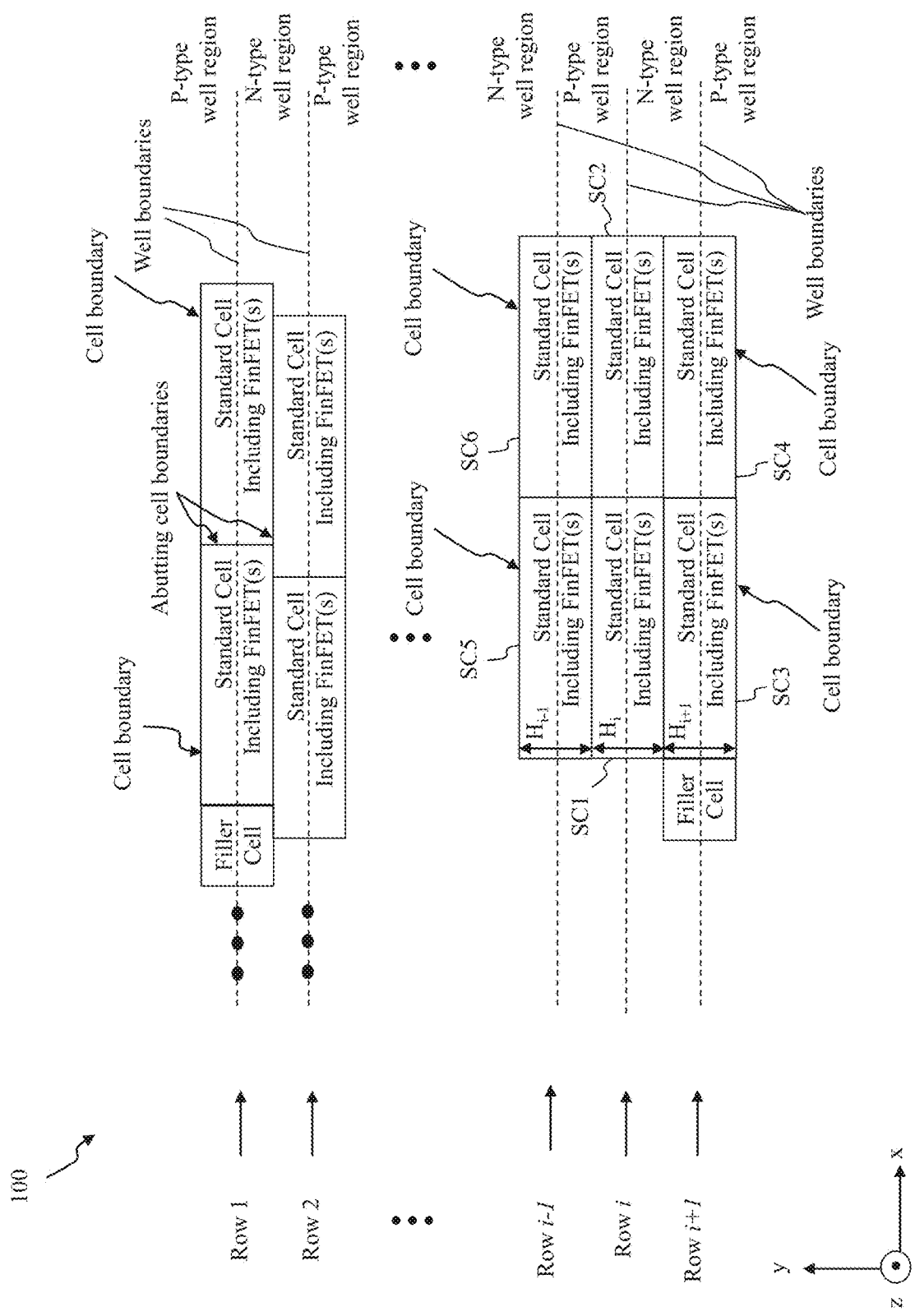
FIG. 1 shows a simplified layout of an integrated circuit device that includes an array of standard cells, in accordance with an embodiment.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term is intended to encompass numbers that are within +/−10% of the number described, unless otherwise specified. For example, the term "about 5 nm" encompasses the dimension range from 4.5 nm to 5.5 nm.

FIG. 1 shows a simplified layout of an integrated circuit device 100 that includes an array of standard cells, in accordance with an embodiment. In semiconductor design, standard cell methodology is a method of designing application-specific integrated circuits (ASICs) with mostly digital-logic features. Standard cell methodology is an example of design abstraction, whereby a low-level very-large-scale integration (VLSI) layout is encapsulated into an abstract logic representation (e.g. such as a NAND gate). Cell-based methodology—the general class to which standard cells belong—makes it possible for one designer to focus on the high-level (logical function) aspect of digital design, while another designer focuses on the implementation (physical) aspect. Along with semiconductor manufacturing advances, standard cell methodology has helped designers scale ASICs from comparatively simple single-function ICs (of several thousand gates), to complex multi-million gate system-on-a-chip (SoC) devices. In various examples, a standard cell (e.g. which may be referred to as a functional cell, a functional logic cell, and/or a circuit region) may include a group of transistors and interconnect structures that implement a circuit, for example, a circuit providing a Boolean logic function (e.g. AND, OR, XOR, XNOR, NAND, NOR, inverters, etc.) or a storage function (e.g. flip-flop or latch). The simplest standard cells are direct representations of the elemental NAND, NOR, and XOR Boolean function, although cells of much greater complexity are commonly used (e.g. such as a 2-bit full-adder or muxed D-input flip-flop).

As illustrated in FIG. 1, the array of standard cells may be arranged in rows, with each row including a plurality of standard cells. Each row extends in a first direction (e.g. an x-direction). Each standard cell is defined by a cell boundary, and adjacent standard cells in a given row may have cell boundaries that abut each other. Additionally, as shown in FIG. 1, standard cells in adjacent rows may have cell boundaries that abut each other. As mentioned above, each standard cell may include a group of transistors and interconnect structures that implement a circuit (e.g. providing a Boolean logic function or a storage function). To implement such functionality, each of the standard cells may include complementary metal-oxide-semiconductor field-effect transistors (CMOSFETs). For example, each of the standard cells may include one or more P-type MOSFETs (PMOSFETs) formed in an N-type well region and one or more N-type MOSFETs (NMOSFETs) formed in a P-type well region. The N-type well regions, the P-type well regions, and the boundaries therebetween are shown in FIG. 1. In an embodiment, each of the one or more PMOSFETs and the one or more NMOSFETs of a standard cell may be implemented using a fin-like field-effect transistor (FinFET) device. However, it is noted that other types of transistor devices may be used, examples being gate-all-around (GAA) transistor devices and planar transistor devices.

As shown in FIG. 1, a row of the array of standard cells (e.g. Row i of FIG. 1) includes a first standard cell SC1 and a second standard cell SC2, which are adjacent to each other (e.g. immediately adjacent to each other) in the first direction (e.g. the x-direction). The Row i is adjacent to Row i+1 and Row i−1 in a second direction (e.g. a y-direction). The second direction may be substantially perpendicular to the first direction. The Row i+1 includes a third standard cell SC3 and a fourth standard cell SC4, which are adjacent to each other in the first direction. Similarly, the Row i−1 includes a fifth standard cell SC5 and a sixth standard cell SC6, which are adjacent to each other in the first direction.

Each of the standard cells SC1, SC2, SC3, SC4, SC5, and SC6 may include one or more multiple-fin FinFET devices, one or more single-fin FinFET devices, or a combination thereof. A multiple-fin FinFET device may be a FinFET device that includes two or more semiconductor fins, where a gate structure (that is common to the two or more semiconductor fins) controls current flow in channel regions of the two or more semiconductor fins. On the other hand, a single-fin FinFET device may be a FinFET device that includes no more than one semiconductor fin, where a gate structure engages the one semiconductor fin and controls current flow in a channel region of the one semiconductor fin. Multiple-fin FinFET devices may be used for high speed applications, while single-fin FinFET devices may be used for low leakage and low power (e.g. low active power and/or low standby power) applications. Consequently, an integrated circuit device 100 having multiple-fin FinFET devices and single-fin FinFET devices may be used for both high performance and low leakage applications, particularly for SoC products.

Standard cells of the array of standard cells may have a respective dimension. For example, in the embodiment of FIG. 1, each standard cell of the Row i may have a dimension $H_i$, each standard cell of the Row i−1 may have a dimension and each standard cell of the Row i+1 may have a dimension $H_{i+1}$. The dimensions $H_i$, and $H_{i-1}$, and $H_{i+1}$, which are measured in the second direction, may correspond to the cell heights of the standard cells of Row i, Row i−1, and Row i+1, respectively. In some embodiments, the dimensions $H_{i-1}$, and $H_{i+1}$ may be in a range of from about 50 nm to about 100 nm.

In some embodiments, such as in the example of FIG. 1, the integrated circuit device 100 may also include a plurality of filler cells. The plurality of filler cells may include dummy cells lacking functionality or circuitry. Additionally or alternatively, the plurality of filler cells may include a well tap cell for biasing the N-type well region and/or P-type well region over which the well tap cell is disposed, with such a well tap cell including well strap structures (e.g. implemented using a plurality of fin structures).

Each of the standard cells of the integrated circuit device 100 may include interconnect structures that are coupled together to implement a given circuit (e.g. providing a Boolean logic function or a storage function). Such interconnect structures of a standard cell may include mid-end-of-line (MEOL) interconnect structures, examples being drain contacts, source contacts, and gate contacts, each of which may be disposed or formed in a dielectric layer (e.g. an inter-layer dielectric layer, often abbreviated as an "ILD layer"). In such examples, the drain contacts, source contacts, and gate contacts may respectively land on and contact (e.g. electrically and/or physically contact) drain features, source features, and gate structures of the FinFET devices of the standard cell.

However, as technology progresses towards smaller technology nodes (e.g. 32 nm, 28 nm, 20 nm, and smaller), there is a corresponding decrease in the dimensions of the standard cells of the integrated circuit device 100. As an example, the cell heights $H_i$, $H_{i-1}$, and $H_{i+1}$ of the standard cells of Row i, Row i−1, and Row i+1 may decrease, and this may result in a corresponding decrease in the dimensions of the interconnect structures of the standard cells. Additionally, a distance between interconnect structures of adjacent standard cells may decrease. For example, the fifth standard cell SC5 is adjacent to the first standard cell SC1 in the second direction, and a distance between a drain contact of the fifth standard cell SC5 and a source contact of the first standard cell SC1 may decrease in tandem with progressively smaller cell heights. Although resulting in greater integration and more efficient use of chip real estate, several challenges accompany the decrease in feature size and the decrease in distance between interconnect structures of adjacent standard cells. For example, in some instances, a drain contact of one standard cell (e.g. the fifth standard cell SC5) may be adjacent to a source contact of another standard cell (e.g. the first standard cell SC1) in the second direction. A typical lithography and etching process used to form these contacts may include initially forming a single continuous conductive structure in an opening and subsequently etching, cutting, or removing a central portion of the single continuous conductive structure, thereby resulting in two separate conductive structures. In this example, the two separate conductive structures formed by such a process are the drain contact of the one standard cell (e.g. the fifth standard cell SC5) and the source contact of the adjacent standard cell (e.g. the first standard cell SC1). Such a typical lithography and etching process relies on an etch mask having a cut window with a critical dimension that is less than or equal to the distance separating the adjacent contacts in the second direction. However, as the dimensions of the standard cells of the integrated circuit device 100 decrease, such critical dimensions for the cut window may be difficult to attain, and this may increase the possibility of failure in the lithography and etching process. Additionally, for an integrated circuit device that includes a plurality of standard cells, there may be a plurality of cut windows that are needed to form the source and drain contacts for each of the standard cells of the integrated circuit device. This, in turn, increases the complexity of the typical lithography and etching process. Furthermore, a decrease in the distance between the adjacent contacts also results in an increase in parasitic capacitances due, at least in part, to the closer proximity of the drain contact of the one standard cell (e.g. the fifth standard cell SC5) and the source contact of the adjacent standard cell (e.g. the first standard cell SC1). Even further, a decrease in feature size results in an increase in the contact resistance of the source and drain contacts.

The present disclosure aims to circumvent the above-described drawbacks that accompany the decrease in feature size. In particular, the present disclosure proposes structural features for the source contacts of the standard cells of the integrated circuit device 100 that result in a decrease in parasitic capacitance between a source contact and an adjacent drain contact, even as technology progresses towards smaller technology nodes. The structural features of the source contacts of the standard cells of the integrated circuit device 100 also lead to a decrease in a contact resistance between a respective source contact and a respective power supply line to which the respective source contact is coupled. The decrease in parasitic capacitance and the decrease in contact resistance also lead to an increase in an operating speed of the standard cells of the integrated circuit device 100. Furthermore, the present disclosure presents one or more embodiment methods that may be used to form the embodiment source contacts. The one or more embodiment methods have less constrained critical dimension requirements and process windows requirements in comparison to the typical lithography and etching process described above.

Figure 2:
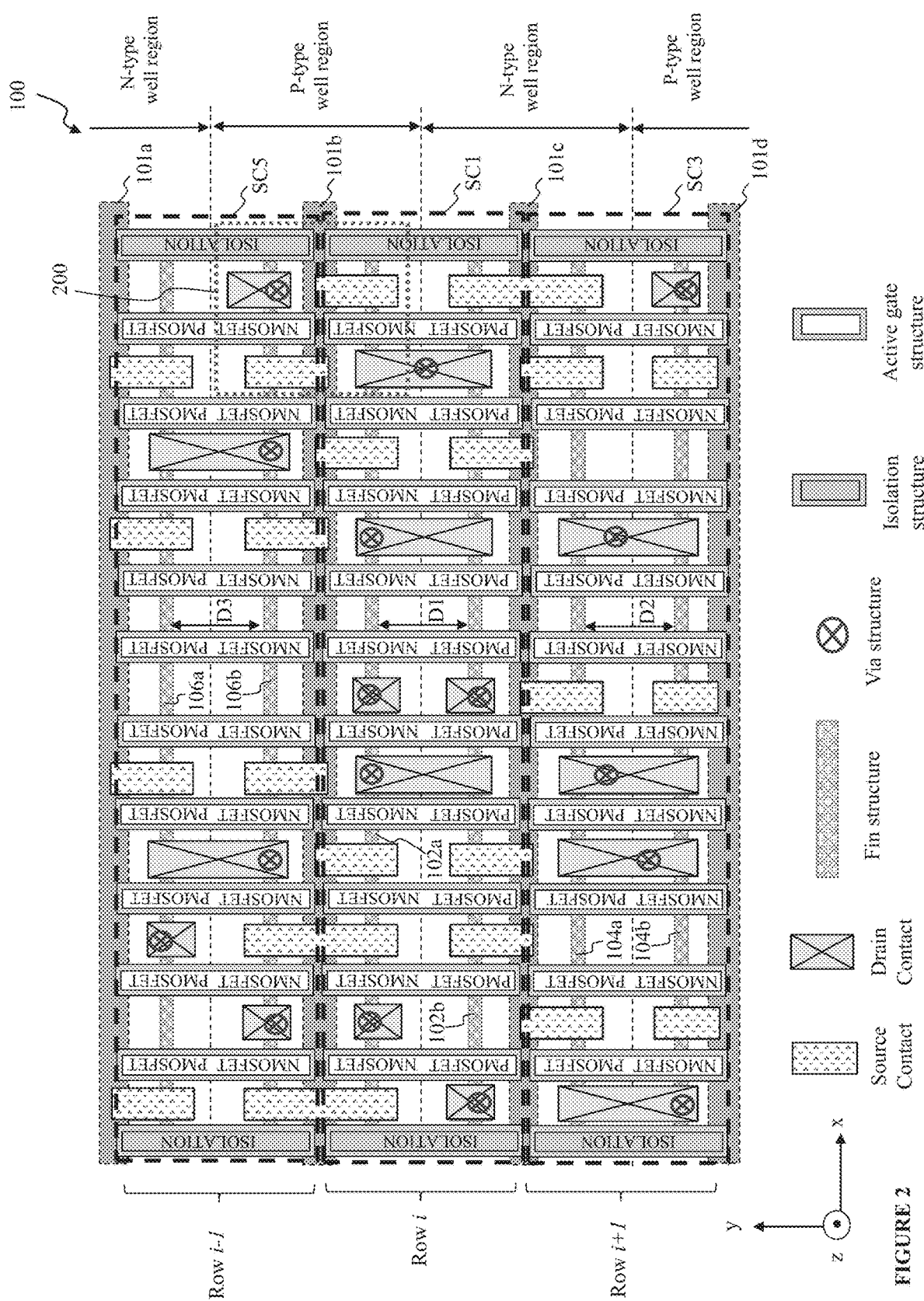
FIG. 2 shows a simplified top-down schematic view of transistor devices formed in some of the standard cells shown FIG. 1, in accordance with an embodiment.

In order to highlight the structural features of the source contacts proposed in this disclosure, reference is first made to FIG. 2, which shows a simplified top-down schematic view of the standard cells SC1, SC3, and SC5 shown in FIG. 1, in accordance with an embodiment. FIG. 2 illustrates the cell boundaries of the first, third, and fifth standard cells SC1, SC3, and SC5. In the example of FIG. 2, the cell boundaries of the first, third, and fifth standard cells SC1, SC3, and SC5 are shown as being aligned along the second direction for the sake of simplicity and clarity. However, in other embodiments, the boundaries of the first, third, and fifth standard cells SC1, SC3, and SC5 may not be aligned to one another along the second direction. As discussed above, standard cells of the integrated circuit device 100 include CMOSFETs, which may be implemented using FinFET devices. Consequently, as seen in FIG. 2, the first standard cell SC1 includes fin structures 102a, 102b that are oriented or routed along the first direction (e.g. the x-direction). Stated differently, the fin structures 102a, 102b extend longitudinally or lengthwise along the first direction. The longitudinal axes of the fin structures 102a, 102b may, as an example, be in a direction of a current flow between source/drain features of the fin structures 102a, 102b, respectively. In some embodiments, the adjacent fin structures 102a, 102b of the first standard cell SC1 may be separated from each other in the second direction by a distance D1, which may be in a range from about 10 nm to about 200 nm.

The fin structure 102a of the first standard cell SC1 may be formed in the P-type well region, while the fin structure 102b of the first standard cell SC1 may be formed in the N-type well region. The fin structure 102a may have an N-type conductivity, and the fin structure 102b may have a P-type conductivity. Consequently, the fin structures 102a and 102b may be active fin structures or device fin structures used to implement an NMOSFET device (e.g. a single-fin N-type FinFET device) and a PMOSFET device (e.g. a single-fin P-type FinFET device), respectively. To implement such transistor devices, the first standard cell SC1 includes active gate structures, each of which engages the fin structures 102a, 102b at channel regions thereof. An active gate structure generally refers to an electrically functional gate structure of a transistor device that is used to enable or control current flow between source and drain regions of the transistor device. Each active gate structure of the first standard cell SC1 extends longitudinally or lengthwise along the second direction (e.g. the y-direction). Stated differently, a longitudinal axis of the each of the active gate structures may be oriented along the second direction, while a transverse axis of the active gate structures may be oriented along the first direction. It is noted that the transverse axes of the fin structures 102a, 102b may be oriented along the second direction.

FIG. 2 also shows drain contacts that land on and contact (e.g. electrically and/or physically contact) drain features of the fin structures 102a, 102b. As shown in FIG. 2, some drain contacts of the first standard cell SC1 contact the fin structure 102a, but not the fin structure 102b. Other drain contacts of the first standard cell SC1 contact the fin structure 102b, but not the fin structure 102a. Yet other drain contacts of the first standard cell SC1 contact both fin structures 102a and 102b. In general, the fin structures 102a, 102b on which the drain contacts land may depend on design requirements of the integrated circuit device 100 and on the specific circuit implemented by the first standard cell SC1. The drain contacts are coupled to one or more overlying metallization layers (e.g. $M_0$ to $M_z$) by via structures that land on and contact (e.g. electrically and/or physically contact) the drain contacts of the first standard cell SC1. The one or more overlying metallization layers are not shown in FIG. 2 for the sake of simplicity and clarity.

The integrated circuit device 100 includes power supply lines 101a to 101d that extend longitudinally or lengthwise along the first direction (e.g. the x-direction). The power supply lines 101a to 101d may be parallel to the fin structures 102a, 102b. Each of the power supply lines 101a to 101d supplies a respective bias voltage (e.g. Vdd or Vss) to the FinFET devices of the integrated circuit device 101. For example, with regards to the first standard cell SC1, FIG. 2 shows source contacts that couple source features of the fin structure 102a to the power supply line 101b (e.g. having a bias voltage Vss). FIG. 2 also shows source contacts that couple source features of the fin structure 102b to the power supply line 101c (e.g. having a bias voltage Vdd). The bias voltage Vss may be configured as ground and/or a negative supply voltage, depending on design requirements, while the bias voltage Vdd may be configured as a positive supply voltage, depending on design requirements.

FIG. 2 also shows isolation structures that are disposed on the boundaries of the first standard cell SC1. The isolation structures of the first standard cell SC1 isolate the first and second standard cells SC1, SC2 from each other and from other standard cells of the Row i. The isolation structures may include a dielectric material such as silicon oxide or silicon nitride, as examples. In the example of FIG. 2, the isolation structures are implemented using dielectric gate structures (also referred to as dummy gate structures). A dummy gate structure generally refers to an electrically non-functioning gate structure of a transistor device. In some embodiments, such as in the example of FIG. 2, the dummy gate structures mimic physical properties of the active gate structures, such as physical dimensions of the active gate structures, but are electrically inoperable and do not enable current to flow between source and drain regions of a transistor device. It is also noted that the dummy gate structures and the active gate structures have the same routing direction (e.g. in the y-direction).

The features described above in reference to the first standard cell SC1 are also observed in the third standard cell SC3 and the fifth standard cell SC5 shown in FIG. 2. For example, the third standard cell SC3 includes fin structures 104a, 104b that are oriented or routed along the first direction. Adjacent fin structures 104a, 104b of the third standard cell SC3 may be separated from each other, in the second direction, by a distance D2, which may be in a similar range of values as described above in reference to the distance D1. The fin structure 104a of the third standard cell SC3 may be formed in the N-type well region, while the fin structure 104b of the third standard cell SC3 may be formed in the P-type well region. The fin structure 104a may have a P-type conductivity, and the fin structure 104b may have an N-type conductivity. Consequently, the fin structures 104a and 104b may be active fin structures or device fin structures used to implement a PMOSFET device and an NMOSFET device, respectively. The third standard cell SC3 includes active gate structures, each of which engages the fin structures 104a, 104b at channel regions thereof. FIG. 2 also shows drain contacts that land on and contact (e.g. electrically and/or physically contact) drain features of the fin structures 104a, 104b of the third standard cell SC3. The drain contacts are coupled to one or more overlying metallization layers by via structures that land on and contact (e.g. electrically and/or physically contact) the drain contacts of the third standard cell SC3. Additionally, source contacts couple source features of the fin structures 104a, 104b to the power supply lines 101c, 101d, respectively. Isolation structures are disposed on the boundaries of the third standard cell SC3. The isolation structures of the third standard cell SC3 isolate the third and fourth standard cells SC3, SC4 from each other and from other standard cells of the Row i+1.

Similarly, the fifth standard cell SC5 includes fin structures 106a, 106b that are oriented or routed along the first direction. Adjacent fin structures 106a, 106b of the fifth standard cell SC5 may be separated from each other, in the second direction, by a distance D3, which may be in a similar range of values as described above in reference to the distance D1. The fin structure 106a of the fifth standard cell SC5 may be formed in the N-type well region, while the fin structure 106b of the fifth standard cell SC5 may be formed in the P-type well region. The fin structure 106a may have a P-type conductivity, and the fin structure 106b may have an N-type conductivity. Consequently, the fin structures 106a and 106b may be active fin structures or device fin structures used to implement a PMOSFET device and an NMOSFET device, respectively. The fifth standard cell SC5 includes active gate structures, each of which engages the fin structures 106a, 106b at channel regions thereof. FIG. 2 also shows drain contacts that land on and contact (e.g. electrically and/or physically contact) drain features of the fin structures 106a, 106b of the fifth standard cell SC5. The drain contacts are coupled to one or more overlying metallization layers by via structures that land on and contact (e.g. electrically and/or physically contact) the drain contacts of the fifth standard cell SC5. Additionally, source contacts couple source features of the fin structures 106a, 106b to the power supply lines 101a, 101b, respectively. Isolation structures are disposed on the boundaries of the fifth standard cell SC5 to isolate the fifth and sixth standard cells SC5, SC6 from each other and from other standard cells of the Row i−1.

Figure 3:
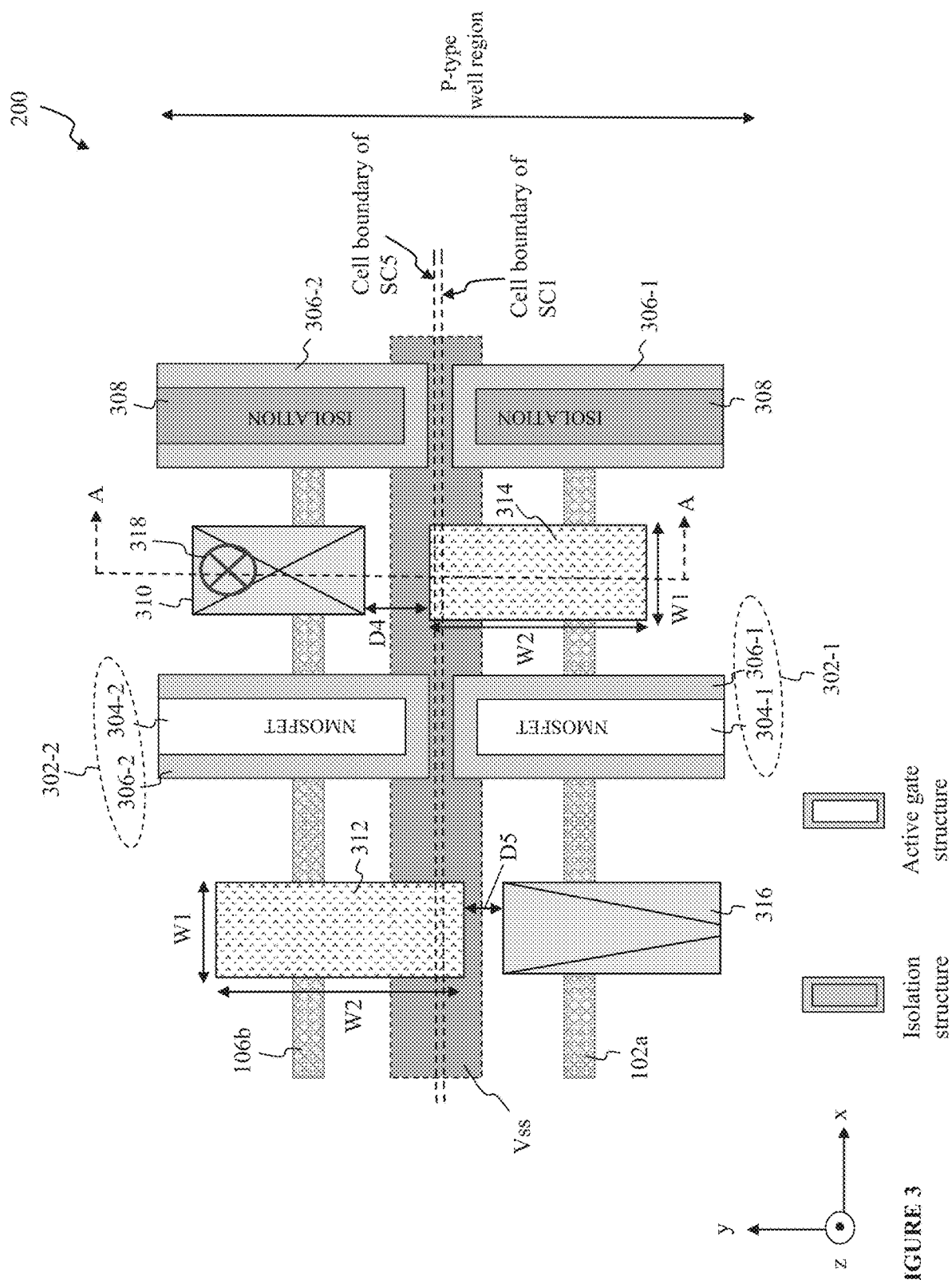
FIG. 3 shows a zoomed-in view of a region of FIG. 2 including a first transistor device of a standard cell and a second transistor device of another standard cell, in accordance with an embodiment.

FIG. 2 illustrates a region 200 of the integrated circuit device 100. FIG. 3 shows a zoomed-in view of the region 200, in accordance with an embodiment. It is noted that while the following description is directed to the region 200 of the integrated circuit device 100, the features described below apply analogously to other regions of the integrated circuit device 100 having a similar structure and layout as the region 200.

FIG. 3 shows an active gate structure 302-1 of the first standard cell SC1 and an active gate structure 302-2 of the fifth standard cell SC5. The active gate structure 302-1 of the first standard cell SC1 includes a gate stack 304-1 and a gate spacer 306-1 disposed along sidewalls of the gate stack 304-1. The active gate structure 302-2 of the fifth standard cell SC5 includes a gate stack 304-2 and a gate spacer 306-2 disposed along sidewalls of the gate stack 304-2. The gate stack 304-1 of the active gate structure 302-1 may include a gate dielectric layer, a barrier layer, a seed layer, and a gate electrode. For example, the gate dielectric layer may contact (e.g. physically contact) a channel region of the fin structure 102a and may include silicon oxide, silicon nitride, or a high-k dielectric material (e.g. k>7.0) including a metal oxide or a silicate of Hf, Al, Zr, La, Mg, Y, Sr, Ba, Ti, Pb, or a combination thereof. As an example, the gate dielectric layer may include hafnium oxide (HfO$_2$), zirconium oxide (ZrO$_2$), lanthanum oxide (La$_2$O$_3$), titanium oxide (TiO$_2$), yttrium oxide (Y$_2$O$_3$), strontium titanate (SrTiO$_3$). The gate dielectric layer may, as an example, be formed using molecular beam deposition (MBD), atomic layer deposition (ALD), plasma-enhanced CVD (PECVD), and the like. The barrier layer of the gate stack 304-1 may include an electrically conductive material such as titanium nitride, although other materials, such as tantalum nitride, titanium, tantalum, or the like, may alternatively be utilized. The barrier layer may be formed using a CVD process, such as PECVD. Work function layers may be included in the gate stack 304-1. For example, P-type work function layer(s) may be formed in regions of the gate stack 304-1 that are used to implement a PMOSFET device, and N-type work function layer(s) may be formed in regions of the gate stack 304-1 that are used to implement an NMOSFET device. The P-type work function layer may include TiN, TaN, Ru, Mo, Al, WN, ZrSi$_2$, MoSi$_2$, TaSi$_2$, NiSi$_2$, WN, other suitable P-type work function materials, or a combination thereof. The N-type work function layer may include Ti, Ag, TaAl, TaAlC, TiAlN, TaC, TaCN, TaSiN, Mn, Zr, other suitable N-type work function materials, or a combination thereof. The seed layer of the gate stack 304-1 is formed over the barrier layer (or the work function layers, if present). The seed layer may include Cu, Ti, Ta, TiN, TaN, the like, or a combination thereof, and may be deposited by ALD, sputtering, physical vapor deposition (PVD), or the like. The gate electrode of the gate stack 304-1 may include a metal-containing material such as TiN, TaN, TaC, Co, Ru, Al, combinations thereof, or multi-layers thereof, and may be formed by, e.g., electroplating, electroless plating, or other suitable method. The gate stack 304-2 of the active gate structure 302-2 may be similar to the gate stack 304-1 of the active gate structure 302-1 in structure and in composition. Consequently, the description provided above in reference to the gate stack 304-1 applies analogously to the gate stack 304-2.

The gate spacers 306-1 of the active gate structure 302-1 may be a single layer or a multi-layer structure. In an embodiment, the gate spacers 306-1 include a low-k (e.g.

k<7.0) dielectric material. The gate spacers 306-1 may include an oxide of silicon (e.g. SiO$_2$), a nitride of silicon (e.g. Si$_3$N$_4$), another dielectric material (e.g. silicon carbide, silicon carbonitride), or combination thereof (e.g. silicon oxynitride). The gate spacers 306-2 of the active gate structure 302-2 may be similar to the gate spacers 306-1 of the active gate structure 302-1 in structure and in composition. Consequently, the description provided above in reference to the gate spacers 306-1 applies analogously to the gate spacers 306-2. The isolation structures of the first and fifth standard cell SC1, SC5 may include a dielectric material 308, such as silicon oxide or silicon nitride. As illustrated in FIG. 3, gate spacers 306-1 and 306-2 are also disposed along sidewalls of the dielectric material 308 in the first standard cell SC1 and the fifth standard cell SC5, respectively.

The fifth standard cell SC5 includes drain contact 310 and source contact 312, while the first standard cell SC1 includes source contact 314 and drain contact 316. As seen in FIG. 3, the via structure 318 is disposed on the drain contact 310 of the fifth standard cell SC5. In some embodiments, a first dimension W1 of each of the source contacts 312, 314 (e.g. measured in the first direction) may be in a range from about 6 nanometers to about 30 nanometers, while a second dimension W2 of each of the source contacts 312, 314 (e.g. measured in the second direction) may be in a range from about 10 nanometers to about 300 nanometers. In some embodiments, a ratio of the dimension W2 to the dimension W1 may be in a range from about 1 to about 50.

As technology progresses towards smaller technology nodes (e.g. 32 nm, 28 nm, 20 nm, and smaller), there is a corresponding decrease in a distance D4 that separates the drain contact 310 of the fifth standard cell SC5 and the source contact 314 of the first standard cell SC1, as measured in the second direction. In like manner, there is also a corresponding decrease in a distance D5 that separates the source contact 312 of the fifth standard cell SC5 and the drain contact 316 of the first standard cell SC1, as measured in the second direction. In some embodiments, the distances D4 and D5 may be in a range from about 5 nm to about 100 nm.

Figure 4:
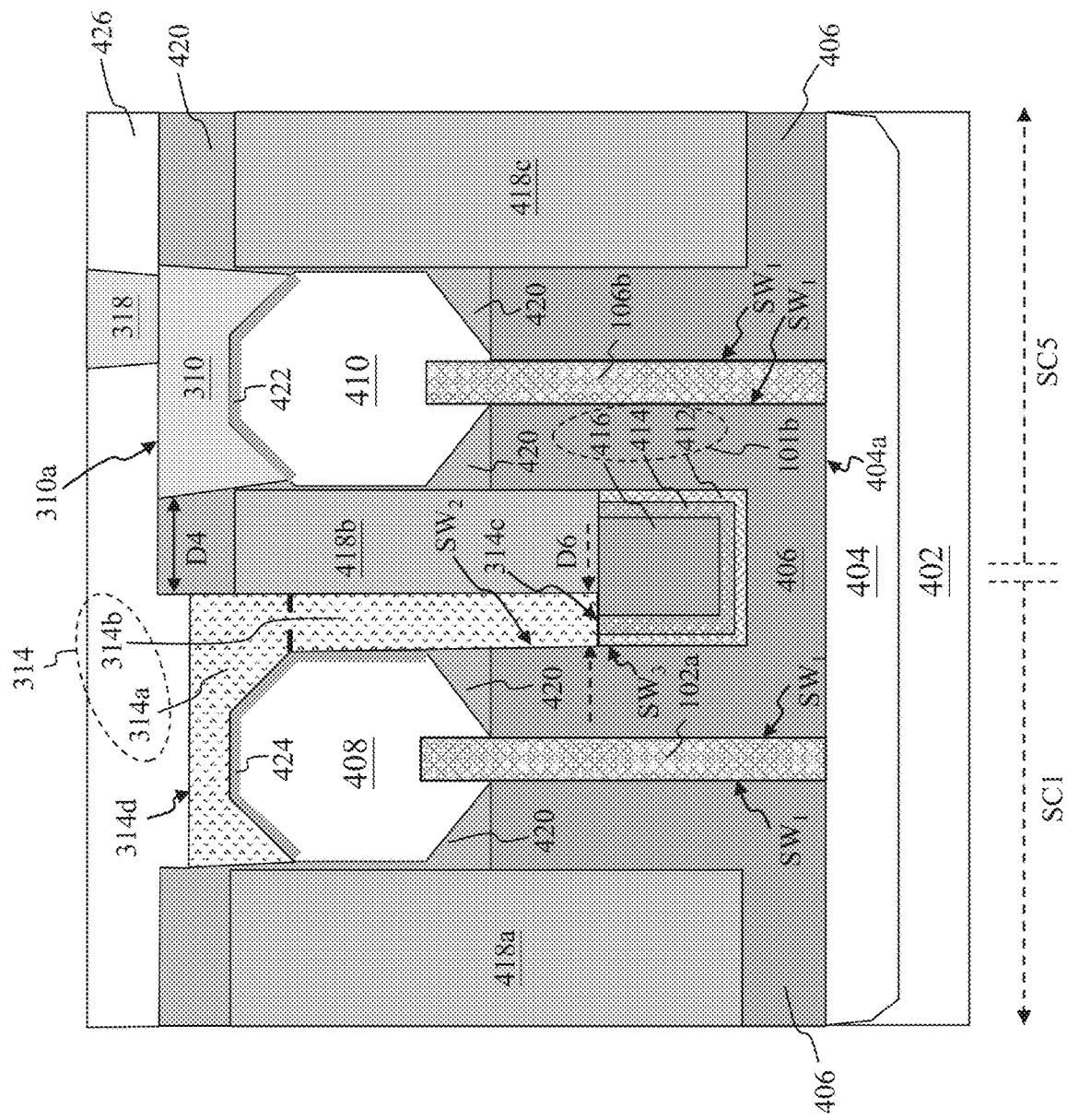
FIG. 4 shows a cross-sectional view of the transistor devices shown in FIG. 3, in accordance with an embodiment.

FIG. 3 illustrates a line A-A along which a cross-sectional view of the first standard cell SC1 and the fifth standard cell SC5 are taken. The cross-sectional view along the line A-A is shown in FIG. 4, which shows a cross-sectional view of the transistor devices of FIG. 3, in accordance with an embodiment. The integrated circuit device 100 includes a substrate 402. The substrate 402 may be a semiconductor substrate, such as a bulk semiconductor, a semiconductor-on-insulator (SOI) substrate, or the like, which may be doped (e.g. with a P-type or an N-type dopant) or undoped. The substrate 402 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. The semiconductor material of the substrate 402 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or a combination thereof.

The substrate 402 includes various doped regions configured according to design requirements of the integrated circuit device 100. For example, the substrate 402 may include P-type doped regions (for example, P-type wells) doped with P-type dopants, such as boron (for example, BF$_2$), indium, other P-type dopants, or combinations thereof. Additionally or alternatively, the substrate 402 may include N-type doped regions (for example, N-type wells) doped with N-type dopants, such as phosphorus, arsenic, other N-type dopants, or combinations thereof. The various doped regions can be formed directly on and/or in the substrate 402, for example, providing P-type well regions and N-type well regions (e.g. shown in FIGS. 1 and 2). An ion implantation process, a diffusion process, or other suitable doping process can be performed either individually or in combination to form the P-type well regions and N-type well regions. In the embodiment of FIG. 4, the P-type well region that is shared by the first standard cell SC1 and the fifth standard cell SC5 is depicted as P-type well region 404. In some embodiments, the P-type well regions of the integrated circuit device 100 have a P-type dopant concentration of about $1\times10^{16}$ cm$^{-3}$ to about $1\times10^{19}$ cm$^{-3}$, while the N-type well regions of the integrated circuit device 100 have an N-type dopant concentration of about $1\times10^{16}$ cm$^{-3}$ to about $1\times10^{19}$ cm$^{-3}$.

As illustrated in FIG. 4, the fin structures 102a and 106b protrude out of the P-type well region 404. For example, the fin structures 102a and 106b protrude from a major surface 404a of the P-type well region 404 in a third direction (e.g. a z-direction). The third direction is substantially perpendicular to the first direction and the second direction. The major surface 404a of the P-type well region 404 may refer to the planar surface of the P-type well region 404 that lies in an x-y plane. As discussed above in reference to FIG. 2, the fin structures 102a and 106b are used to implement NMOSFETs and may have an N-type conductivity. As such, the fin structures of the integrated circuit device 100 having an N-type conductivity (e.g. fin structures 102a, 106b, 104b) may have an N-type dopant concentration of about $1\times10^{16}$ cm$^{-3}$ to about $1\times10^{19}$ cm$^{-3}$. It is also noted that fin structures of the integrated circuit device 100 having a P-type conductivity (e.g. fin structures 102b, 104a, 106a) may have a P-type dopant concentration of about $1\times10^{16}$ cm$^{-3}$ to about $1\times10^{19}$ cm$^{-3}$.

A first dielectric layer 406 conformally lines the major surface 404a of the P-type well region 404 and the sidewalls SW1 of the fin structures 102a and 106b. The first dielectric layer 106 may be an isolation feature, such as a shallow trench isolation feature (STI). The first dielectric layer 406 may include a single dielectric material layer or multiple dielectric material layers. Suitable dielectric materials for the first dielectric layer 404 include silicon oxides, silicon nitrides, silicon carbides, fluoro-silicate glass (FSG), low-K dielectric materials, other suitable dielectric materials, or a combination thereof. In the example of FIG. 4, the fin structures 102a and 106b extend out of the first dielectric layer 406 in the third direction. However, in other embodiments, the portions of the first dielectric layer 406 lining the fin structures 102a, 106b have top surfaces that are substantially co-planar with top surfaces of the fin structures 102a and 106b.

An epitaxial source feature 408 may be formed on a source region of the fin structure 102a, while an epitaxial drain feature 410 may be formed on a drain region of the fin structure 106b. In the example of FIG. 4, the epitaxial source feature 408 and the epitaxial drain feature 410 are N-type features including silicon, silicon carbide (SiC), silicon phosphorous (SiP), phosphorous-doped silicon carbon (SiCP), the like, or a combination thereof. In some embodiments, the epitaxial source feature 408 and the epitaxial drain feature 410 may have an N-type dopant concentration of about $5\times10^{19}$ cm$^{-3}$ to about $1\times10^{22}$ cm$^{-3}$. It is noted that P-type epitaxial source/drain features of the integrated circuit device 100 (e.g. the source/drain features of fin structures 102b, 104a, 106a) may include silicon, germanium, silicon germanium (SiGe), silicon germanium carbon (SiGeC), or a combination thereof as well as a P-type impurity such as boron or indium. Such P-type epitaxial source/drain features of the integrated circuit device 100 may have a P-type dopant concentration of about $1\times10^{19}$ cm$^{-3}$ to about $6\times10^{21}$ cm$^{-3}$. In the embodiment of FIG. 4, where the fin structures 102a, 106b extend out of the first dielectric layer 406, the epitaxial source feature 408 wraps the source region of the fin structure 102a, while the epitaxial drain feature 410 wraps the drain region of the fin structure 106b.

The power supply line 101b is disposed in a trench that is defined by the first dielectric layer 406. Stated differently, the power supply line 101b may be buried in an insulating layer and may be laterally adjacent to transistor features. The power supply line 101b may, as an example, define a boundary between the first standard cell SC1 and the fifth standard cell SC5 and may be laterally adjacent to the fin structure 102a and to the fin structure 106b in the second direction. The power supply line 101b may include a barrier layer 412, a seed layer 414, and a conductive material 416. The barrier layer 412 may include an electrically conductive material such as Ti, TiN, Ta, TaN, or the like. The seed layer 414 may be formed of tungsten, copper, or copper alloys. The conductive material 416 may include tungsten, although other suitable materials such as aluminum, copper, tungsten nitride, platinum, ruthenium, silver, gold, rhodium, molybdenum, nickel, cobalt, cadmium, zinc, alloys of these, combinations thereof, and the like, may alternatively be utilized.

As shown in FIG. 4, the integrated circuit 100 may include fill fins 418a, 418b, 418c that extend out of the first dielectric layer 406 in the third direction. In other words, the fill fins 418a, 418b, 418c extend upwardly from trenches defined by the conformal first dielectric layer 406. Like the fins structures 102a, 106b, the fill fins 418a, 418b, 418c extend longitudinally or lengthwise in the first direction. The fill fins 418a, 418b, 418c are dielectric features filling a space between adjacent fin structures of the integrated circuit device 100 (e.g. the fin structures 102a, 106b) and may tune overall fin pattern density, reinforce the mechanical strength of the fin structures of the integrated circuit device 100, and enhance the manufacturing capability. The epitaxial drain feature 410 may be located in a space between adjacent fill fins 418b, 418c in the second direction, as illustrated in FIG. 4. Consequently, as discussed below in reference to the method shown in FIGS. 6A to 6Q, the adjacent fill fins 418b, 418c may be used to self-align the epitaxial drain feature 410 to the drain region of the fin structure 106b.

The dielectric material of the fill fins 418 may be different from that of the first dielectric layer 406 (e.g. to achieve etching selectivity). For example, the dielectric material of the fill fins 418 may be a high-k dielectric material, such as a metal oxide, examples being hafnium oxide (HfO$_2$), zirconium oxide (ZrO$_2$), aluminum oxide (Al$_2$O$_3$), or the like. As another example, the dielectric material of the fill fins 418 may include a carbon-containing dielectric material, such as silicon carbon oxide, silicon carbon oxynitride, silicon carbon nitride, or a combination thereof.

FIG. 4 also shows a second dielectric layer 420, which acts as an insulator that supports and isolates conductive traces (such as contacts, vias and metal lines) to be formed therein. The second dielectric layer 420 may be an ILD layer and may include any suitable dielectric material, such as a silicon oxide, low-k dielectric material, porous dielectric material, other suitable dielectric material, or a combination thereof. As examples, the second dielectric layer 420 may include silicon oxide, doped silicon oxide such as borophosphosilicate glass (BPSG), tetraethylorthosilicate (TEOS) oxide, un-doped silicate glass, fused silica glass (FSG), phosphosilicate glass (PSG), boron doped silicon glass (BSG), silicon nitride, silicon oxynitride, silicon carbide, low-k dielectric material, other suitable materials, or combinations thereof.

The drain contact 310 is disposed in the second dielectric layer 420 and contacts (e.g. physically contacts) the epitaxial drain feature 410. Stated differently, the drain contact 310 is encapsulated in the second dielectric layer 410, and a portion of the drain contact 310 contacts (e.g. physically contacts) one or more upward-facing surfaces of the epitaxial drain feature 410. The drain contact 310 may include any suitable electrically conductive material, such as Ta, Ti, Al, Ni, Mo, Pt, Ru, Cu, Co, W, TiN, TaN, other suitable conductive materials, or combinations thereof. The portion of the drain contact 310 that contacts the epitaxial drain feature 410 is located in the space between adjacent fill fins 418b, 418c in the second direction. As such, the adjacent fill fins 418b, 418c may also serve to self-align the drain contact 310 to the epitaxial drain feature 410 (this is discussed below in reference to the method shown in FIGS. 6A to 6Q). In some embodiments, such as in the example of FIG. 4, a drain silicide layer 422 is disposed between the one or more upward-facing surfaces of the epitaxial drain feature 410 and the drain contact 310. The drain silicide layer 422 may include a material of the epitaxial drain feature 410 and a silicide of nickel, platinum, palladium, vanadium, titanium, cobalt, tantalum, ytterbium, zirconium, other suitable metal, or combinations thereof.

As seen in FIG. 4, the source contact 314 includes a lateral component 314a (also referred to as a lateral portion) that extends in the second direction (e.g. the y-direction). The lateral component 314a contacts (e.g. physically contacts) one or more upward-facing surfaces of the epitaxial source region 408. The source contact 314 also includes a vertical component 314b (also referred to as a vertical portion) that extends in the third direction (e.g. the z-direction) towards the power supply line 101b. A surface 314c of the vertical component 314b directed towards the power supply line 101b (e.g. the bottom surface of the vertical component 314b) may physically contact the power supply line 101b. As a result of the physical contact made between the source contact 314 and the power supply line 101b, the epitaxial source feature 408 may be biased at a voltage that is substantially equal to the voltage carried by the power supply line 101b.

In some examples, a dimension D6 of the surface 314c of the vertical component 314b that is in contact with the power supply line 101b, as measured in the second direction, may be greater than about 12 nanometers (e.g. in a range from about 8 nm to about 30 nm). When the dimension D6 is in the above-stated range of values, the contact area made between the surface 314c of the vertical component 314b and the power supply line 101b is maximized, while keeping the source contact 314 within the boundary of the first standard cell SC1. As a result, contact resistance between the source contact 314 and the power supply line 101b is minimized, which in turn increases an operating speed of the first standard cell SC1 by at least 0.5% (e.g. in a range from about 0.5% to about 10%).

Figure 5A:
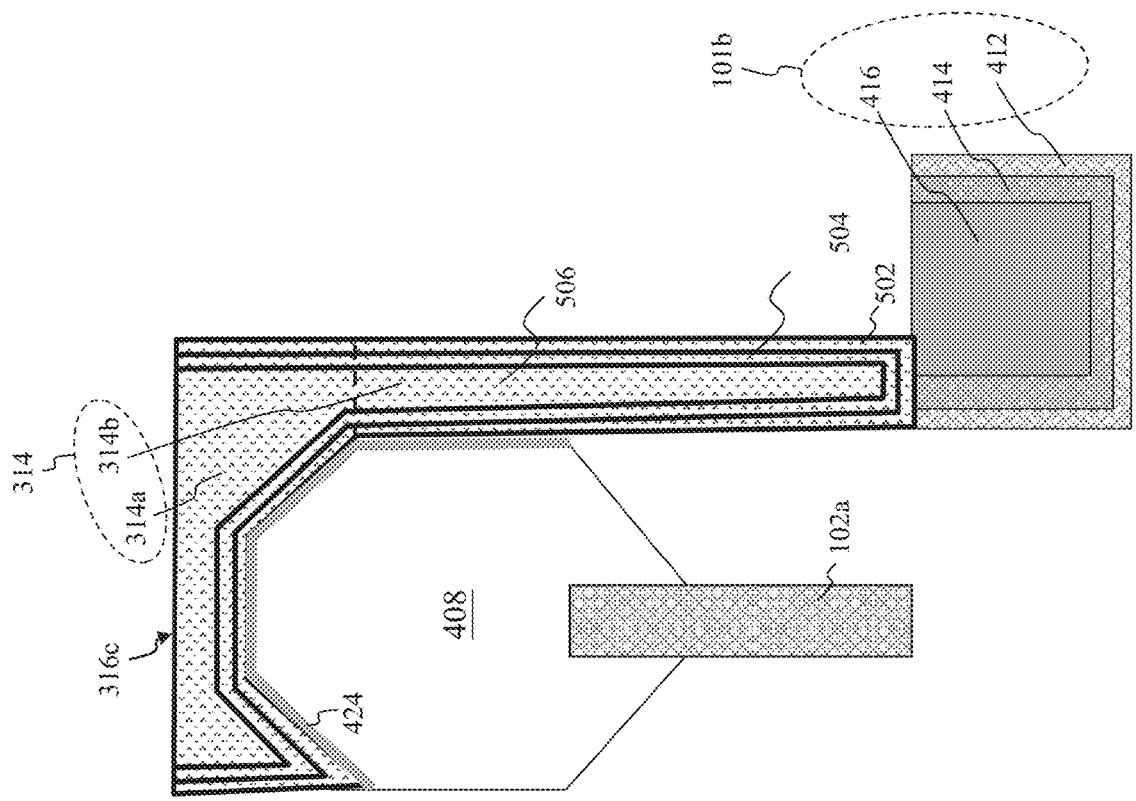
FIGS. 5A and 5B show zoomed-in views of a source contact and a power supply line shown in FIG. 4, in accordance with an embodiment.
Figure 5A:
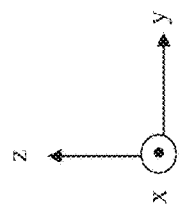
Figure 5B:
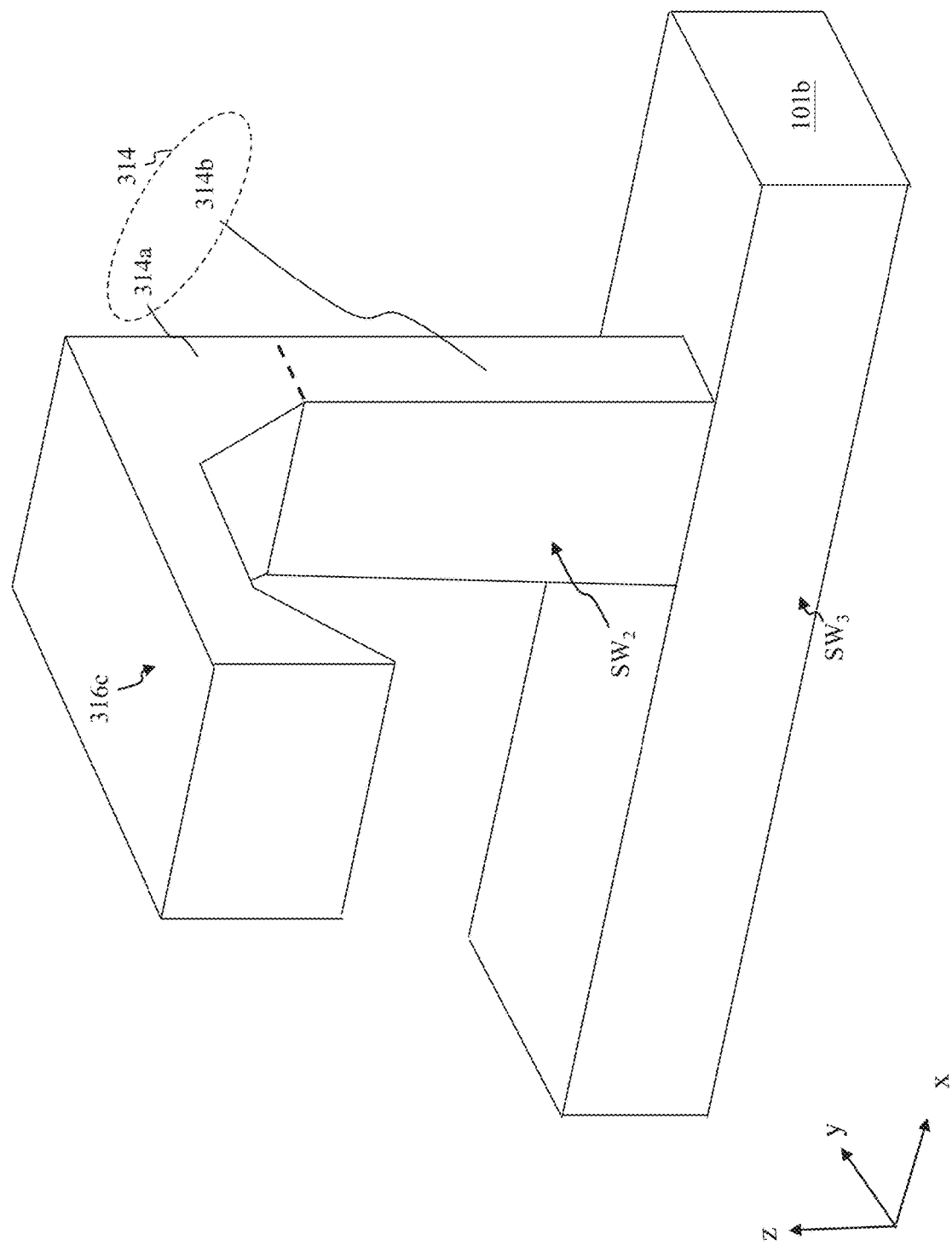

FIGS. 5A and 5B shows a zoomed-in view of the source contact 314 and the power supply line 101b, in accordance with an embodiment. As seen in FIG. 5A, the source contact 314 may include a barrier layer 502, a seed layer 504, and a conductive material 506. The barrier layer 502 may be include one or more materials described above in reference to the barrier layer 412 of the power supply line 101b. The seed layer 504 may include one or more materials described above in reference to the seed layer 414 of the power supply line 101b. The conductive material 506 may include one or more materials described above in reference to the conductive material 416 of the power supply line 101b.

In the example of FIG. 4, a sidewall SW2 of the vertical component 314b may be aligned with a sidewall SW3 of the power supply line 101b. In some embodiments, such as in the example of FIG. 4, a source silicide layer 424 is disposed between the epitaxial source feature 408 and the source contact 314. The source silicide layer 424 may include a material of the epitaxial source feature 408 and a silicide of nickel, platinum, palladium, vanadium, titanium, cobalt, tantalum, ytterbium, zirconium, other suitable metal, or combinations thereof. An etch stop layer 426 may be disposed over the second dielectric layer 420 and over a surface 314d of the source contact 314 directed away from the substrate 402. The etch stop layer 426 may include a dielectric material such as silicon nitride ($Si_3N_4$), silicon oxide ($SiO_2$), silicon oxynitride (SiON), and/or other materials. The via structure 318 is disposed in the etch stop layer 416. The via structure 318 may include one or more of the materials described above in reference to the drain contact 310.

As seen in the example of FIG. 4, the surface 314d of the source contact 314 directed away from the substrate 402 is recessed in comparison with a surface 310a of the drain contact 310 directed away from the substrate 402. In such embodiments, this offset between the surfaces 314d and 310a may result in a decrease in an area of overlap between sidewall surfaces of the drain contact 310 and the source contact 314 that face each other. This decrease in the area of overlap results in a corresponding decrease in a parasitic capacitance between the drain contact 310 and the source contact 314 (e.g. in comparison with typical source and drain contacts that are formed in an ILD layer, where each of the typical source and drain contacts is coupled to an overlying metallization layer by a respective via structure). This, in turn, increases an operating speed of the first standard cell SC1 and the fifth standard cell SC5 by at least 0.1% (e.g. in a range of 0.1% and 5%).

Figure 6B:
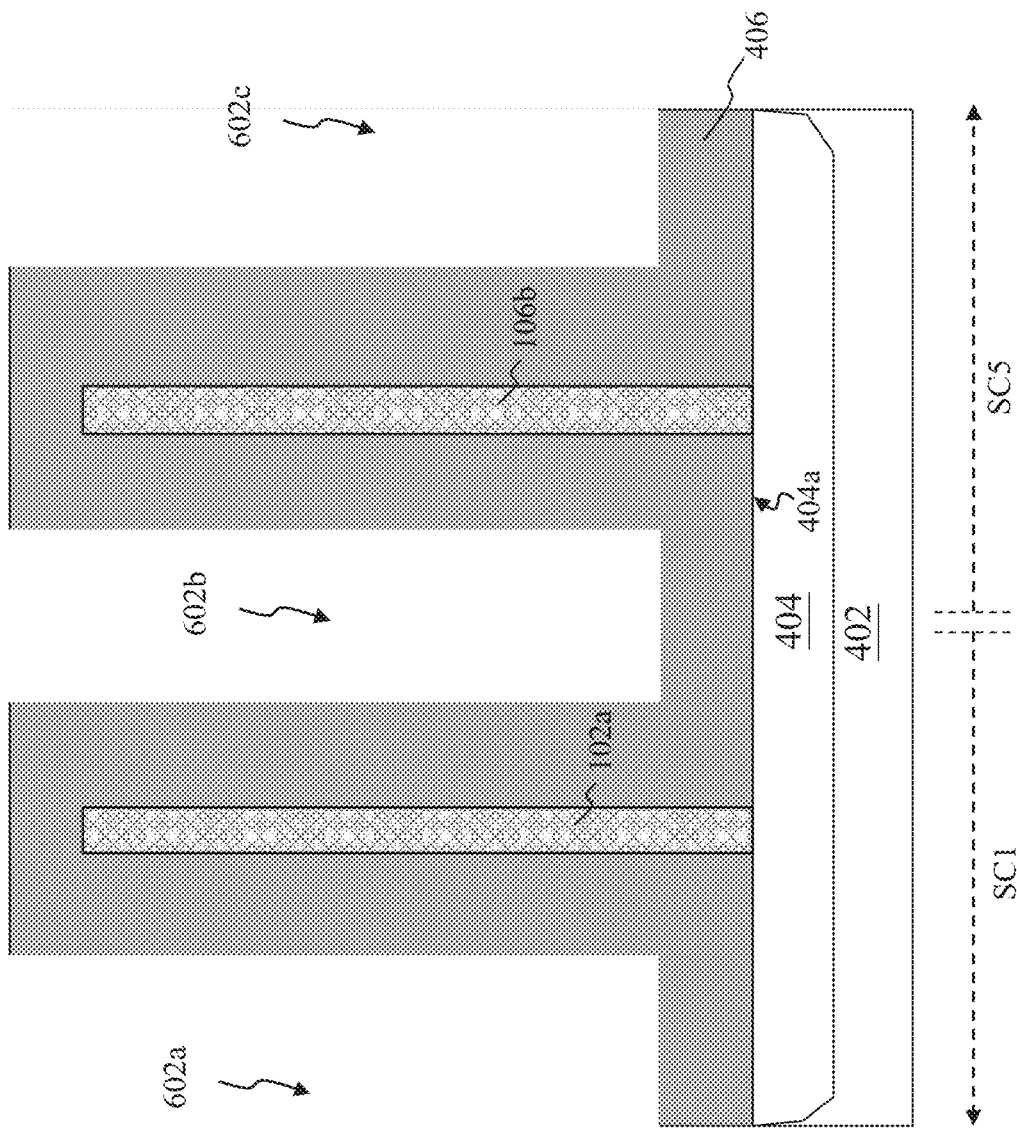
FIGS. 6A to 6Q show a process flow illustrating a method for forming transistor devices of the array of standard cells of FIG. 1, in accordance with an embodiment.
Figure 6C:
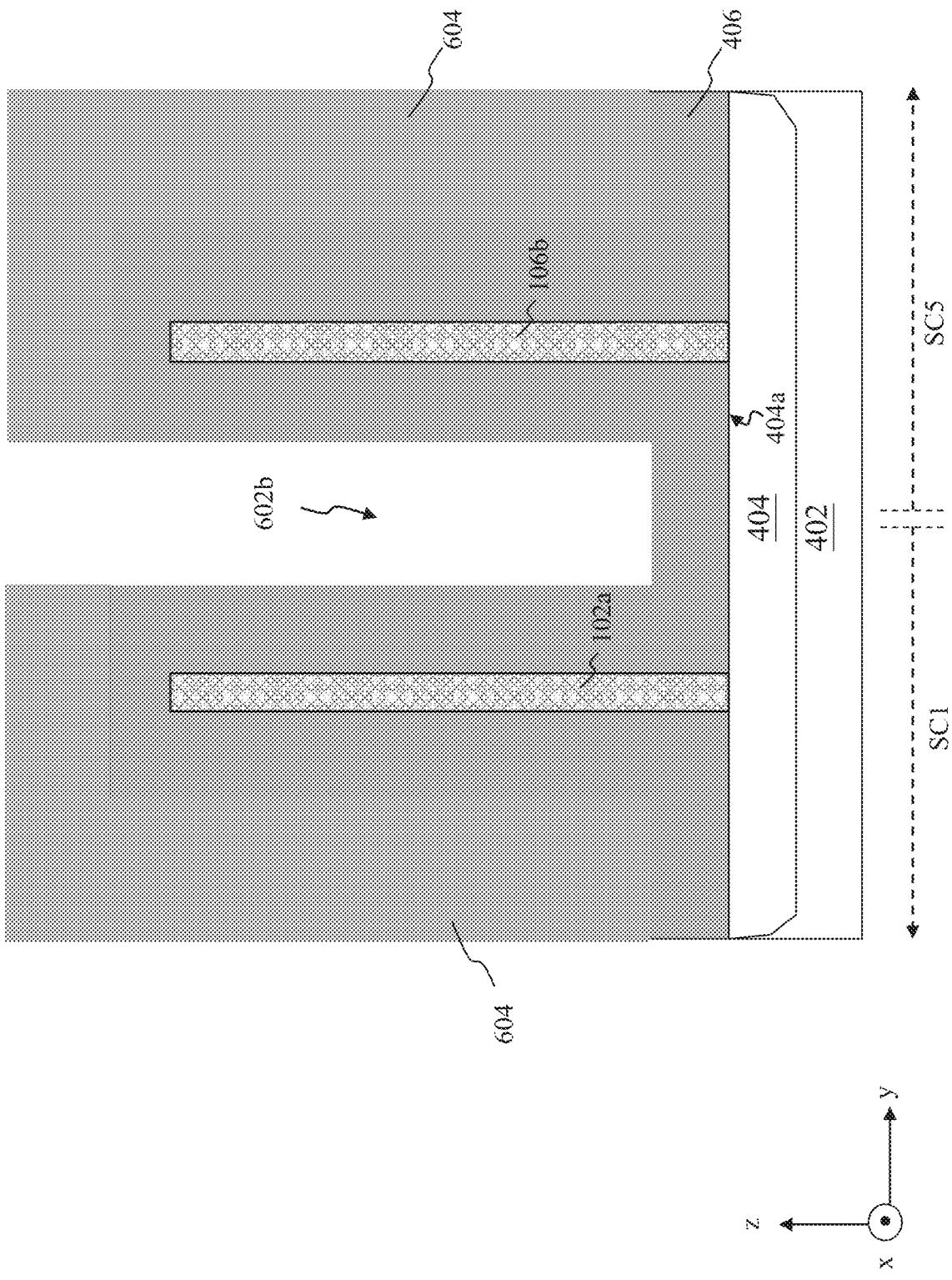
Figure 6D:
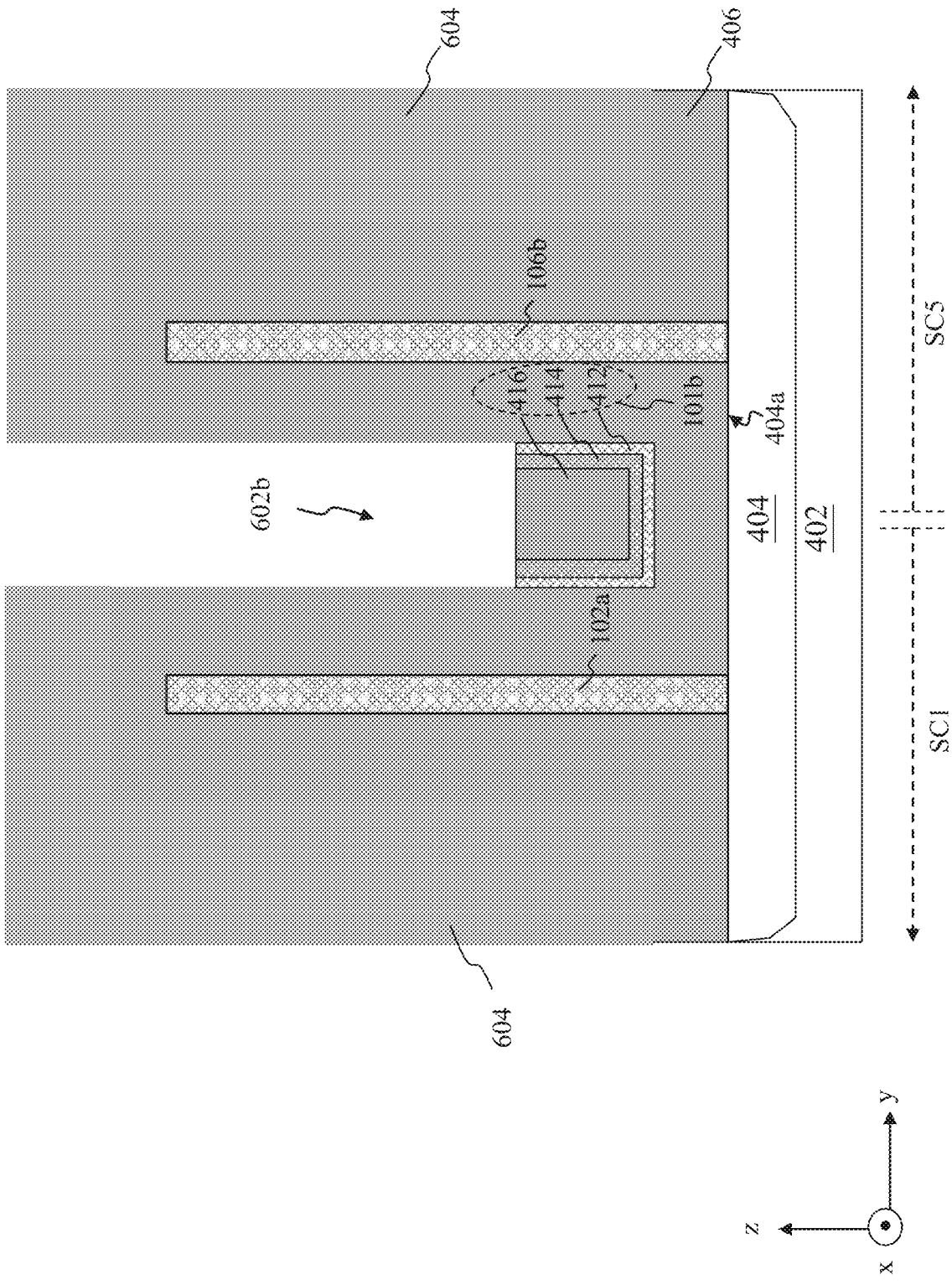
Figure 6E:
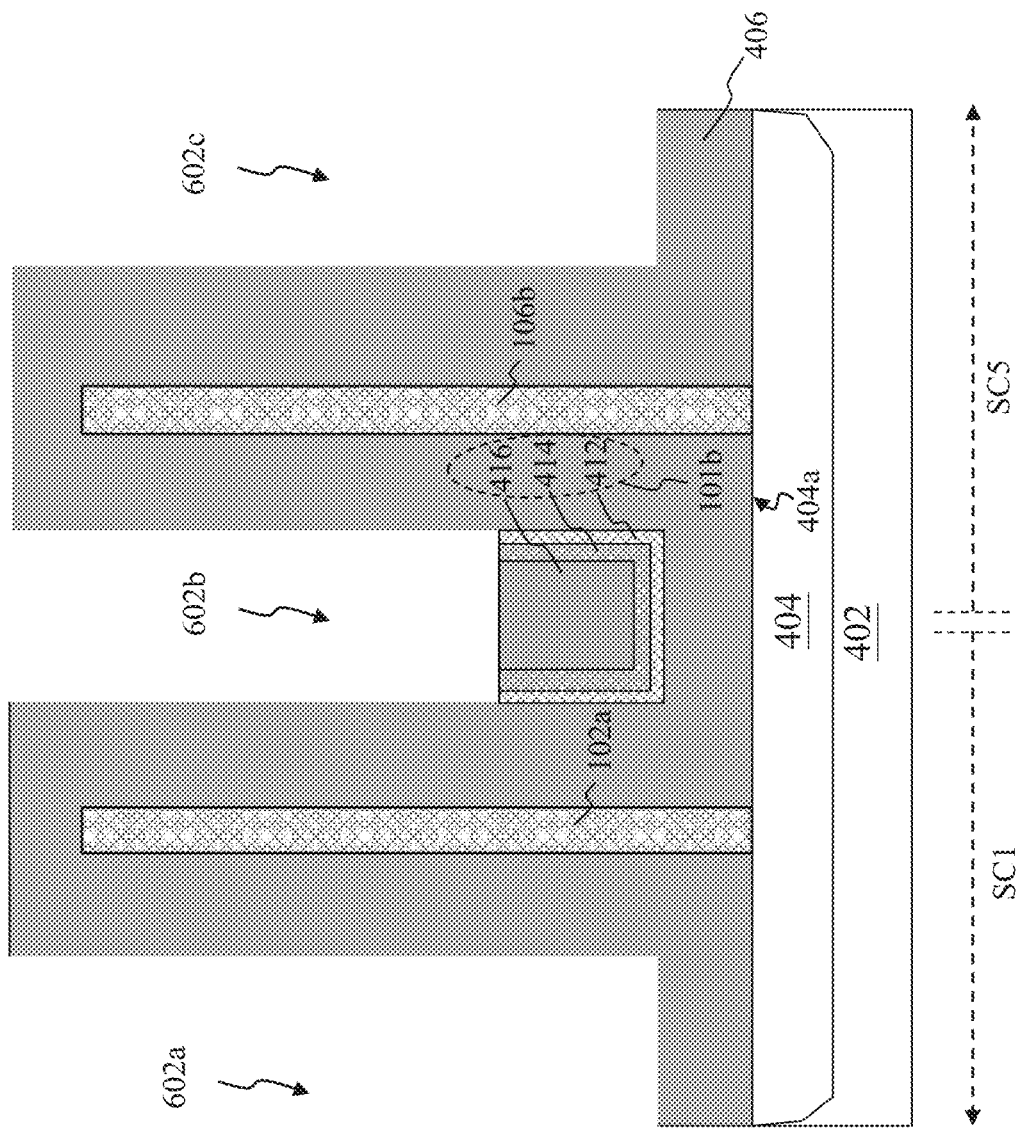
Figure 6F:
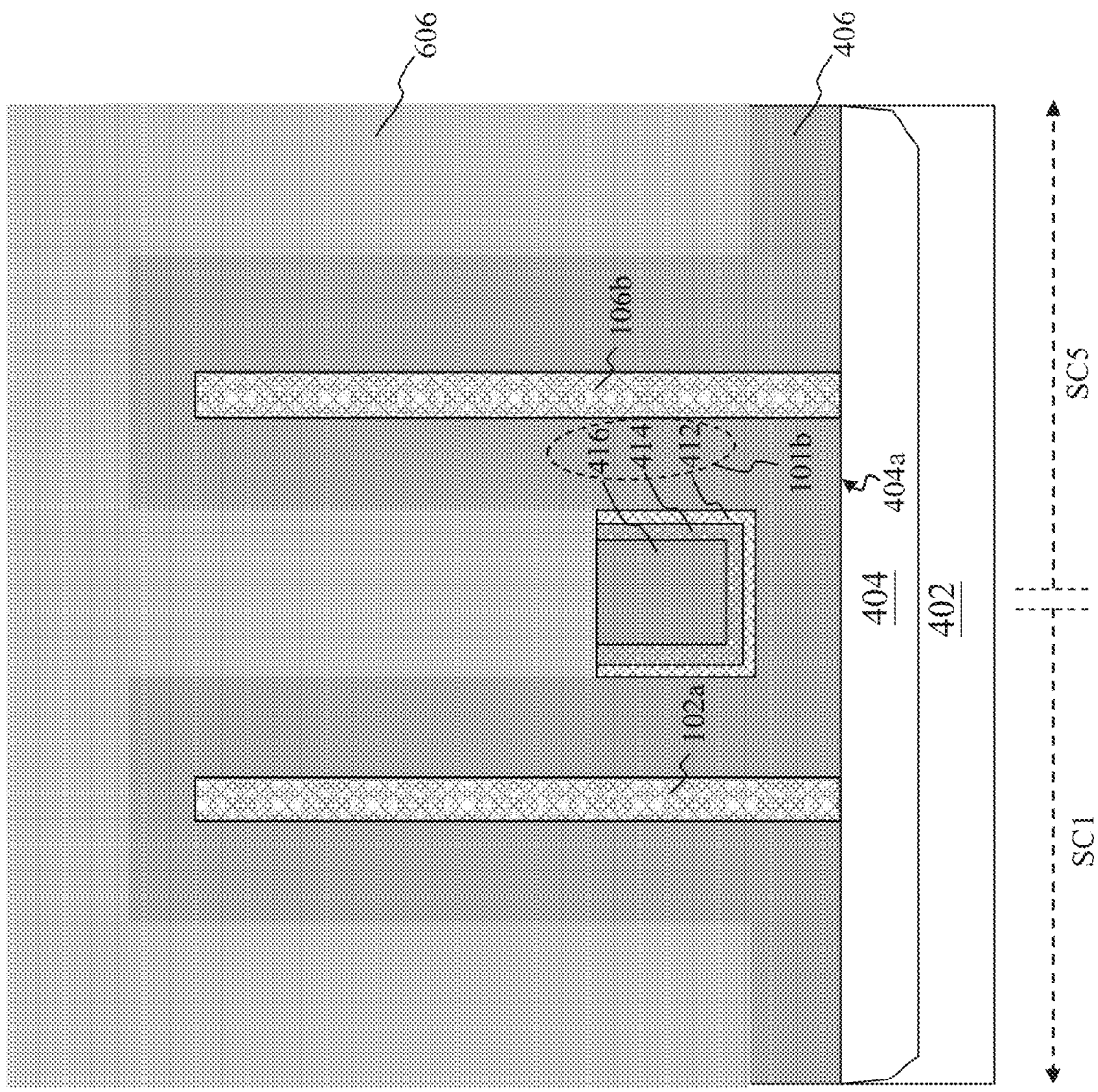
Figure 6G:
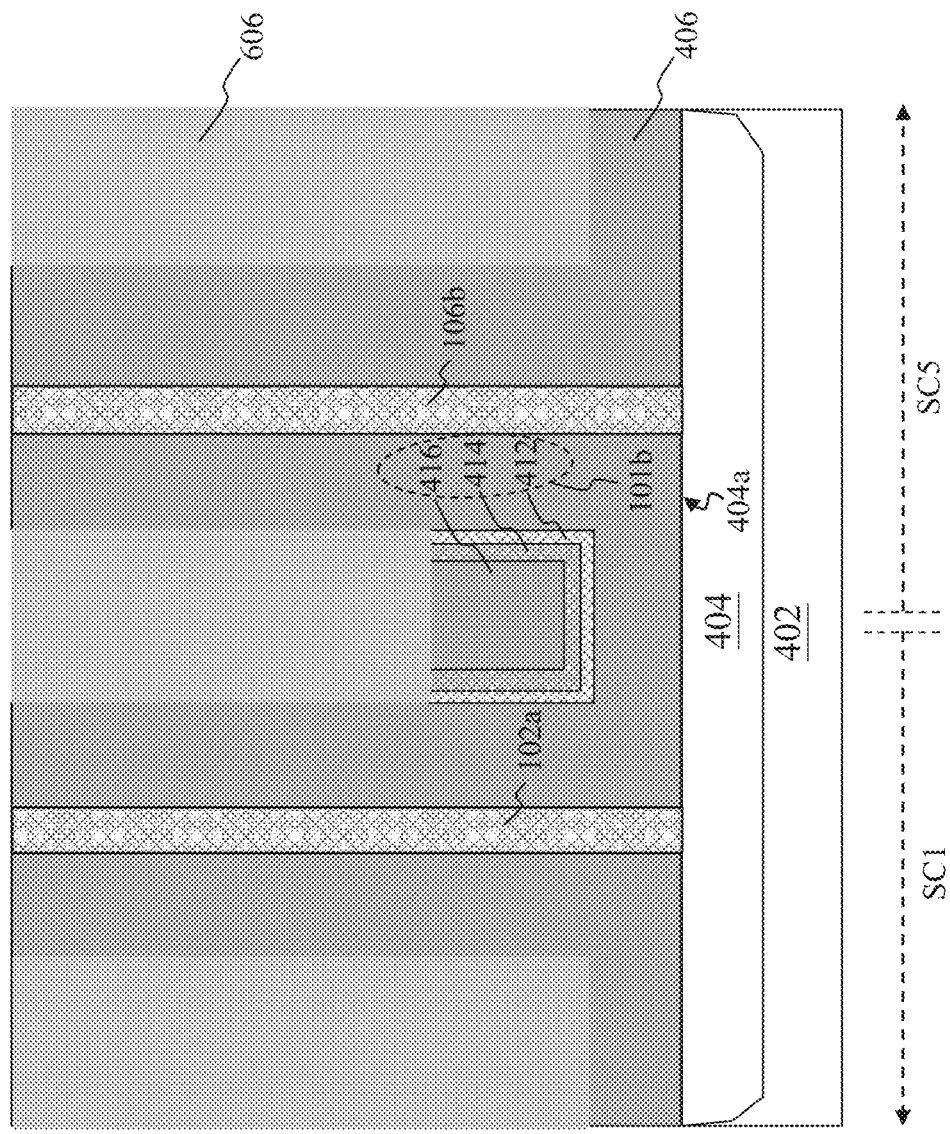
Figure 6H:
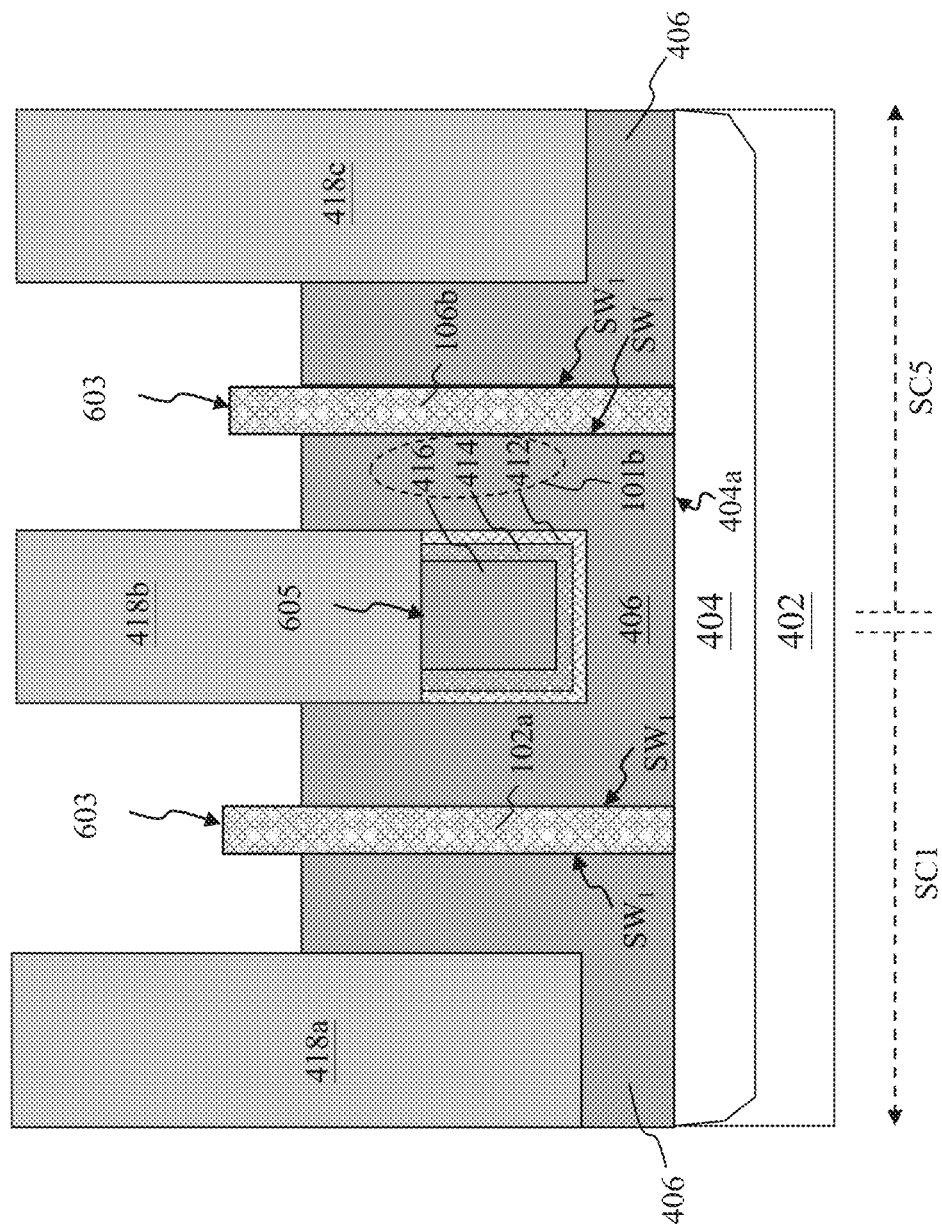
Figure 6I:
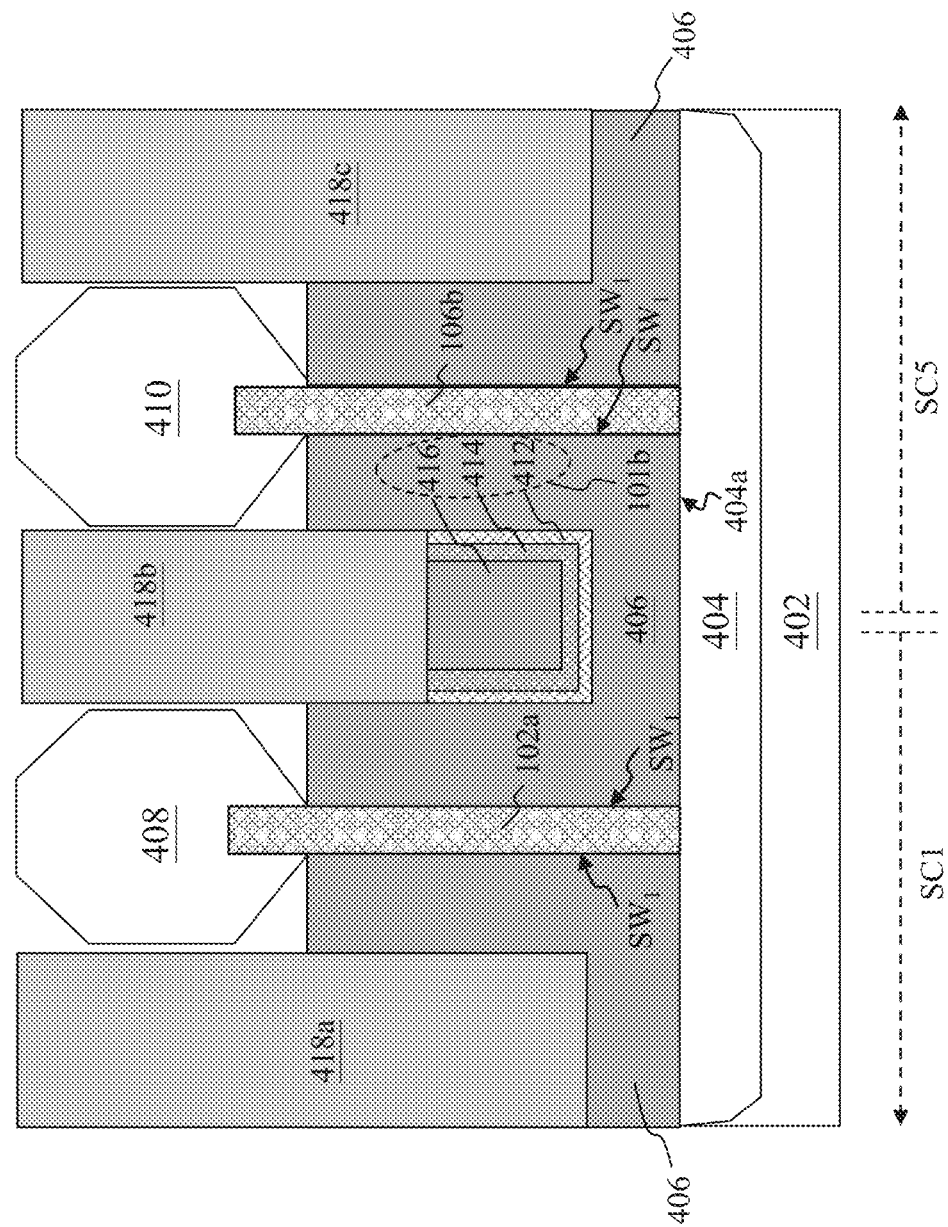
Figure 6J:
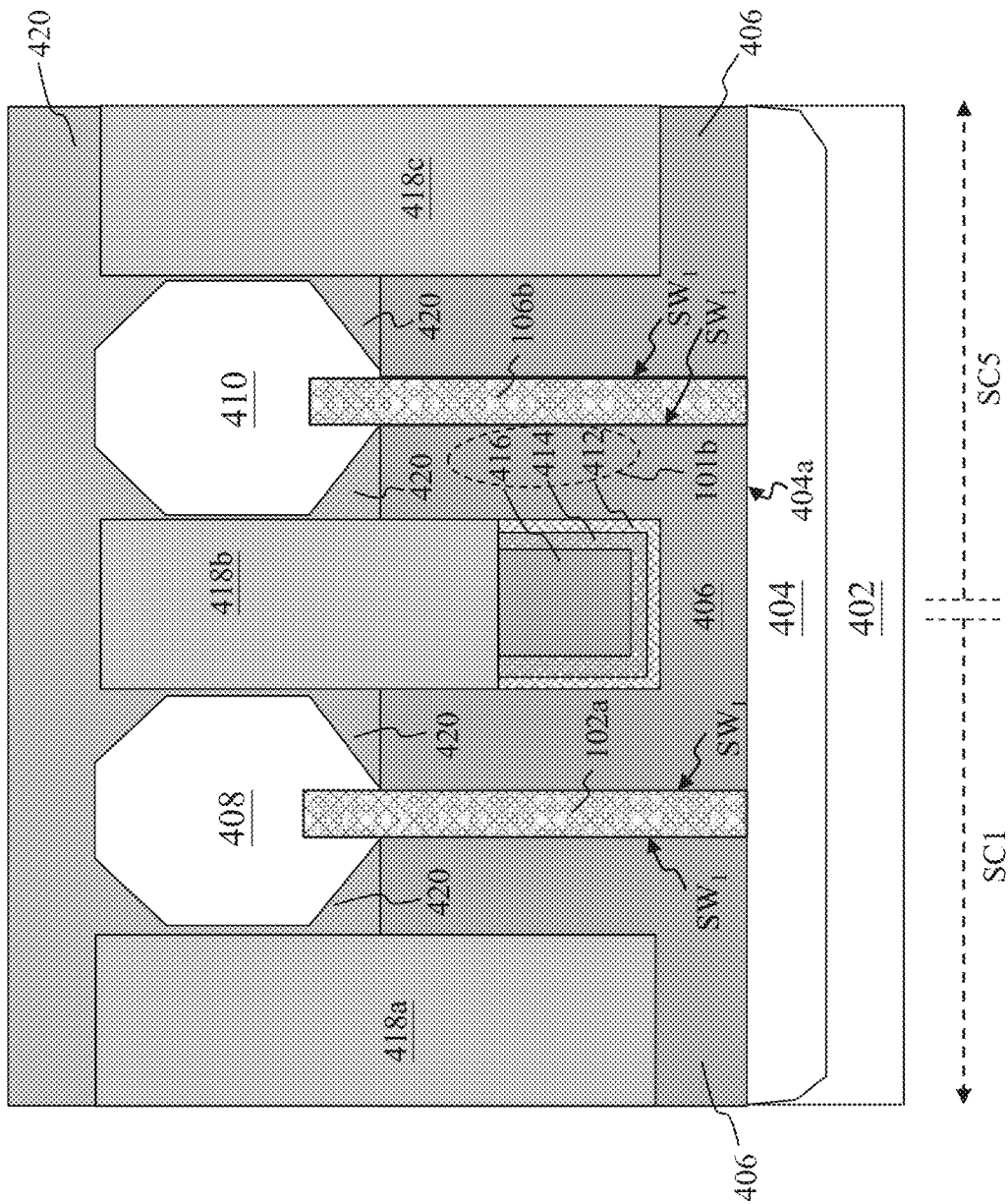
Figure 6K:
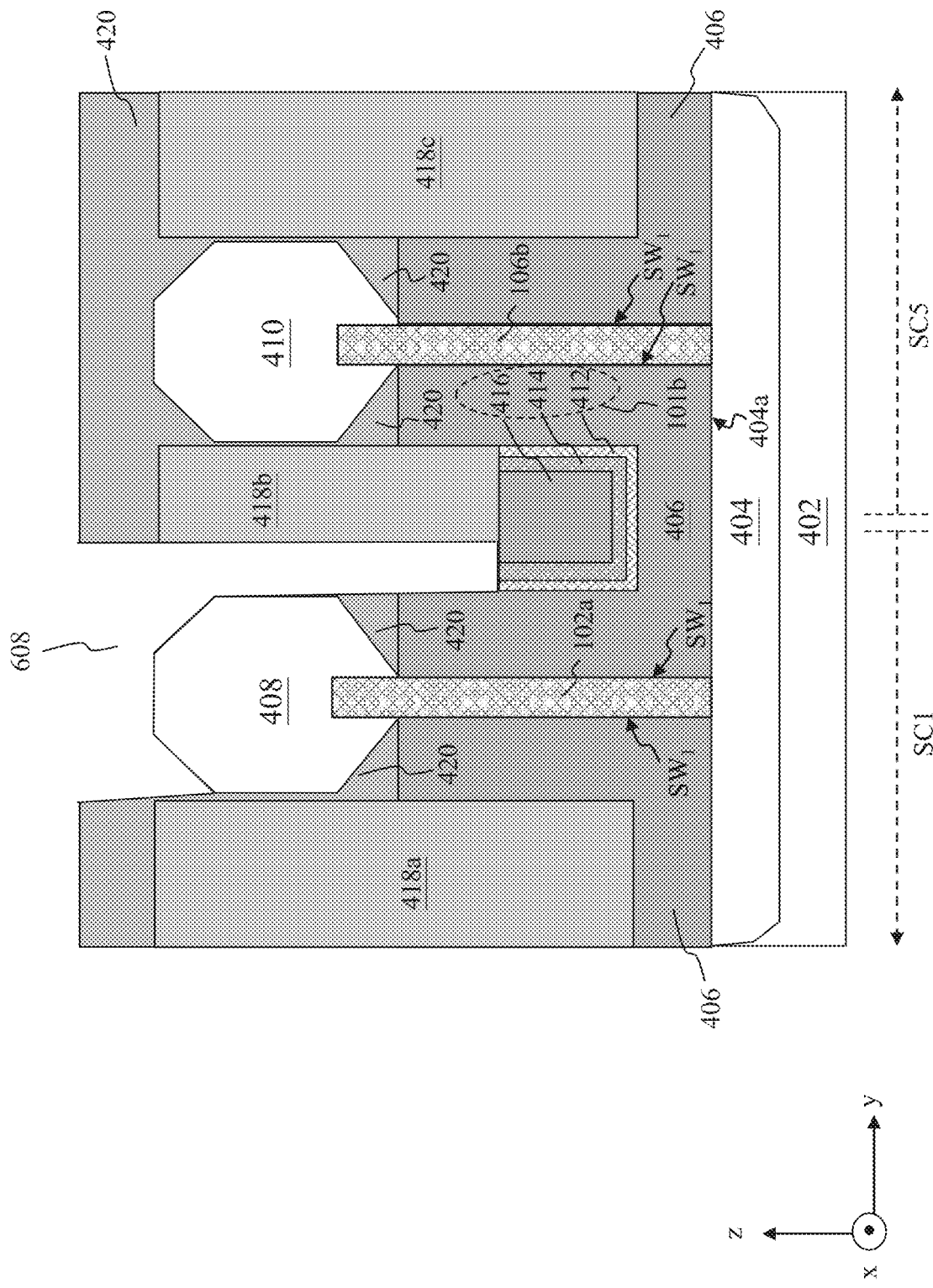
Figure 6L:
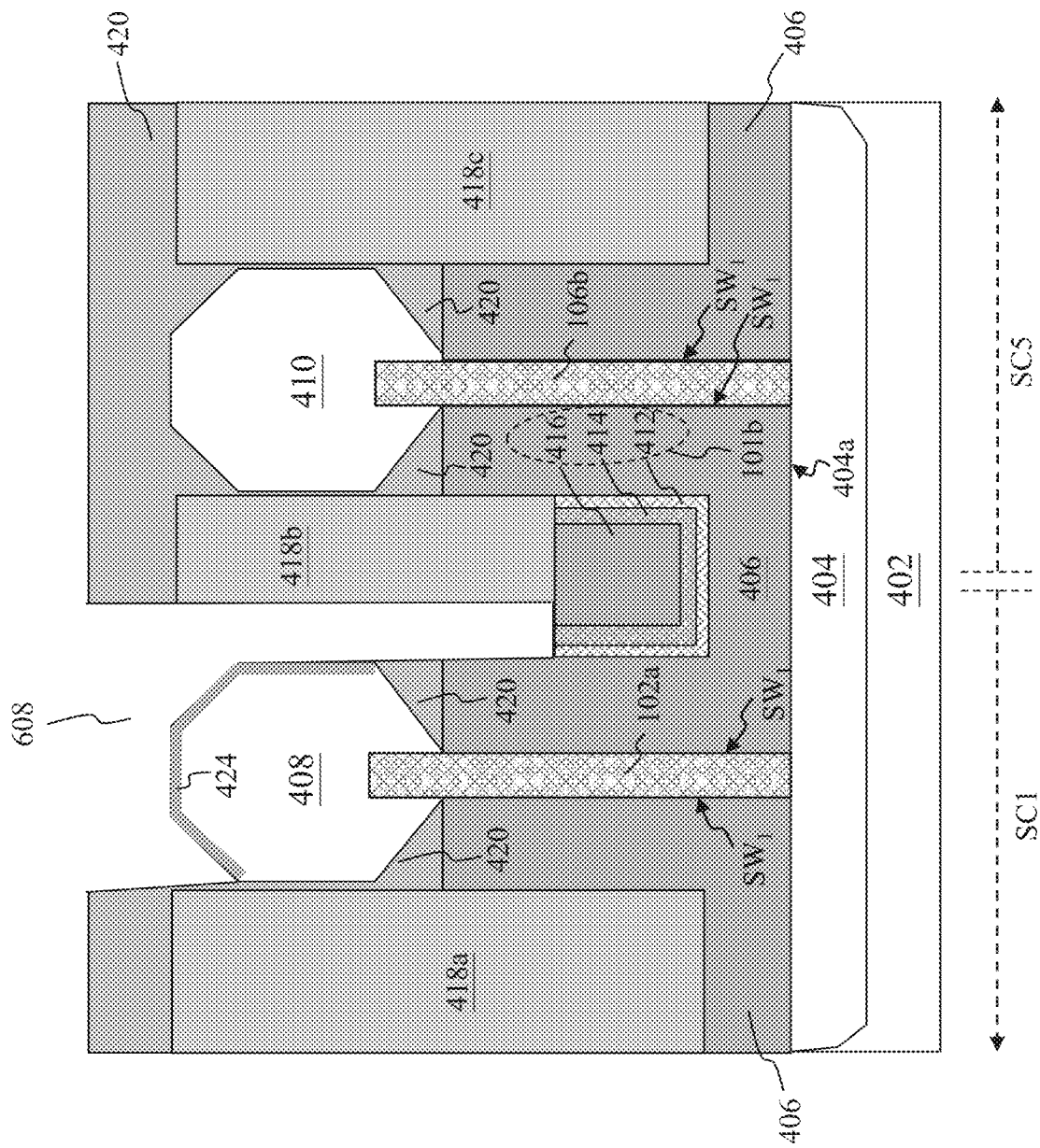
Figure 6M:
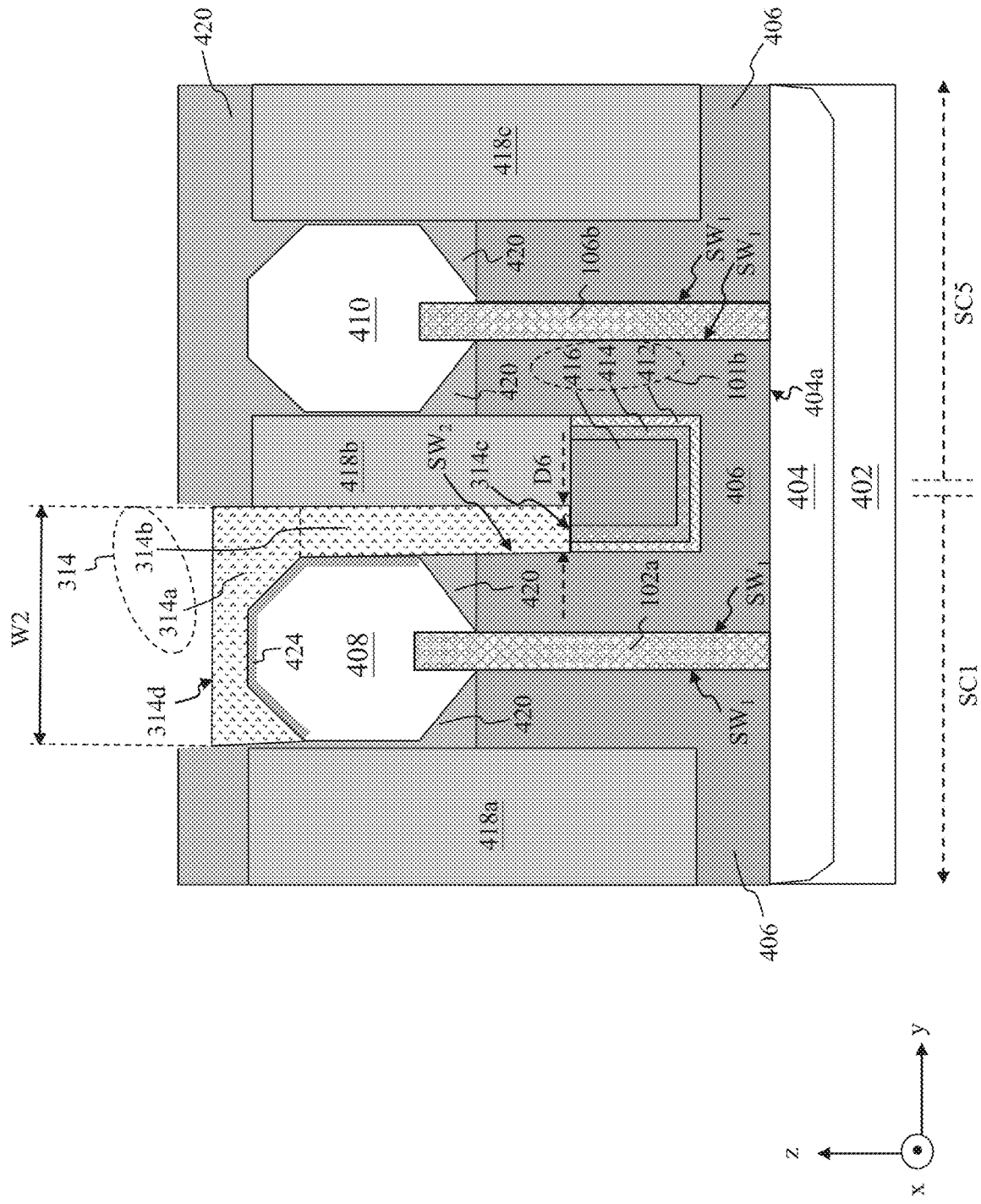
Figure 6N:
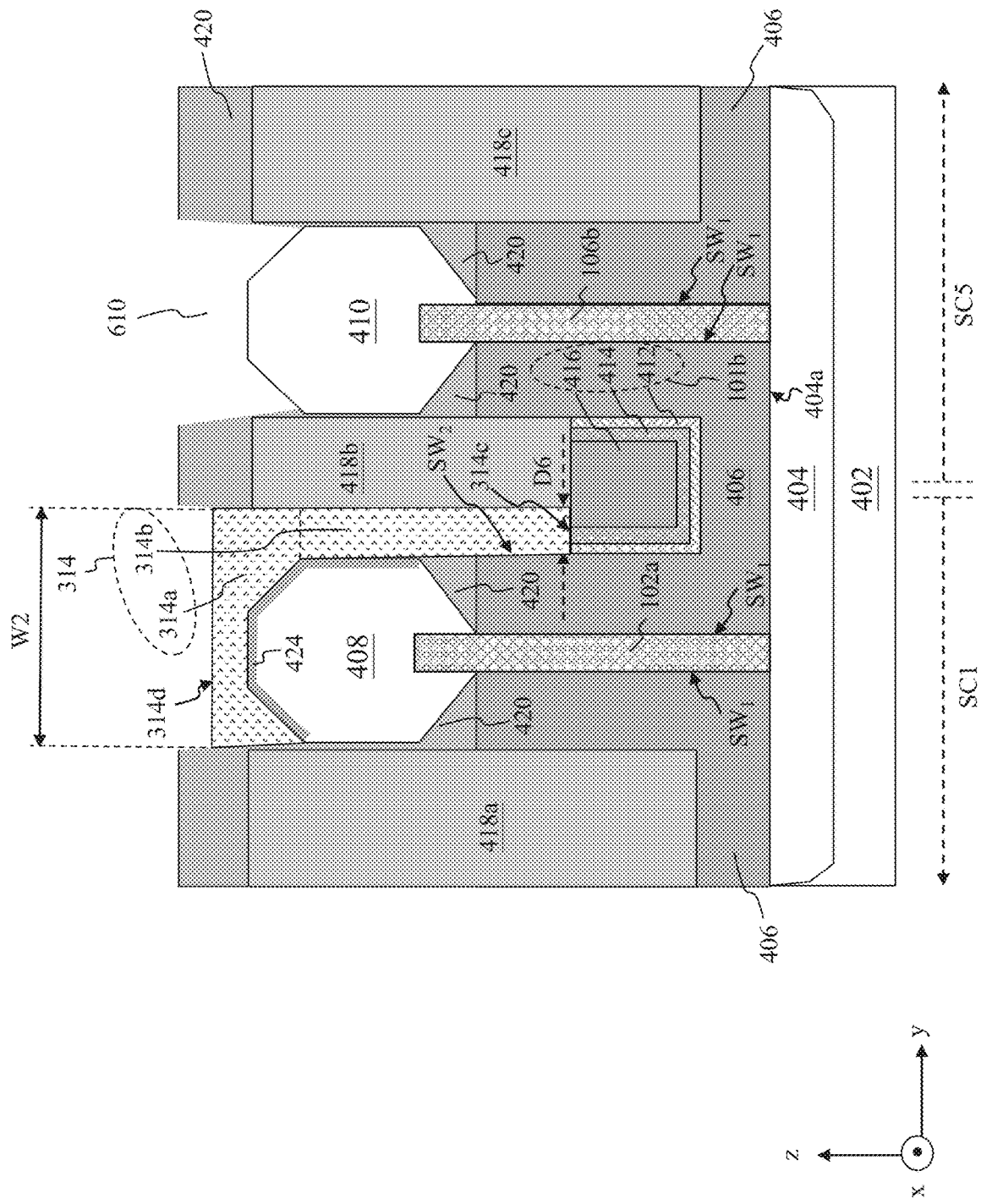
Figure 6O:
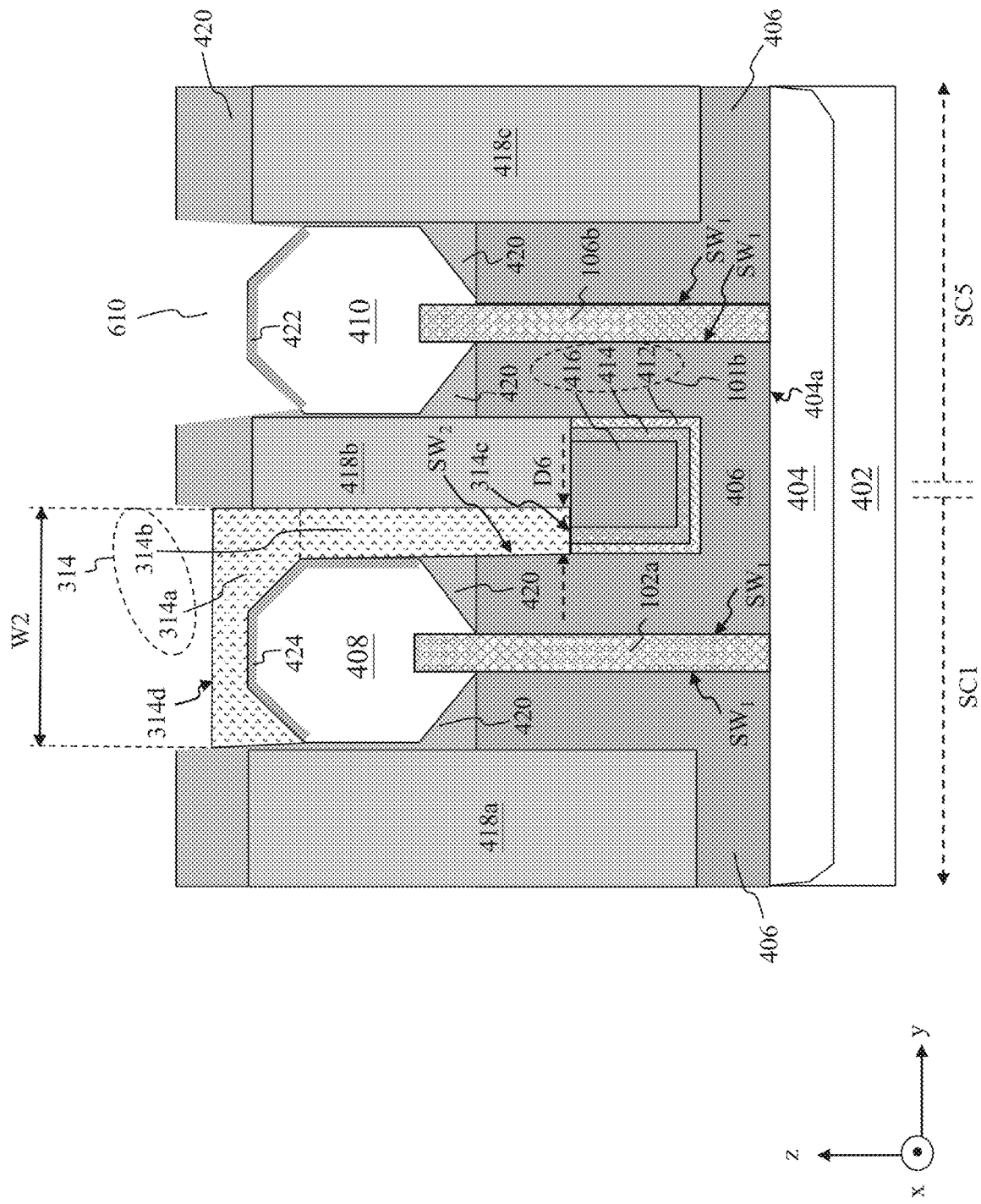
Figure 6P:
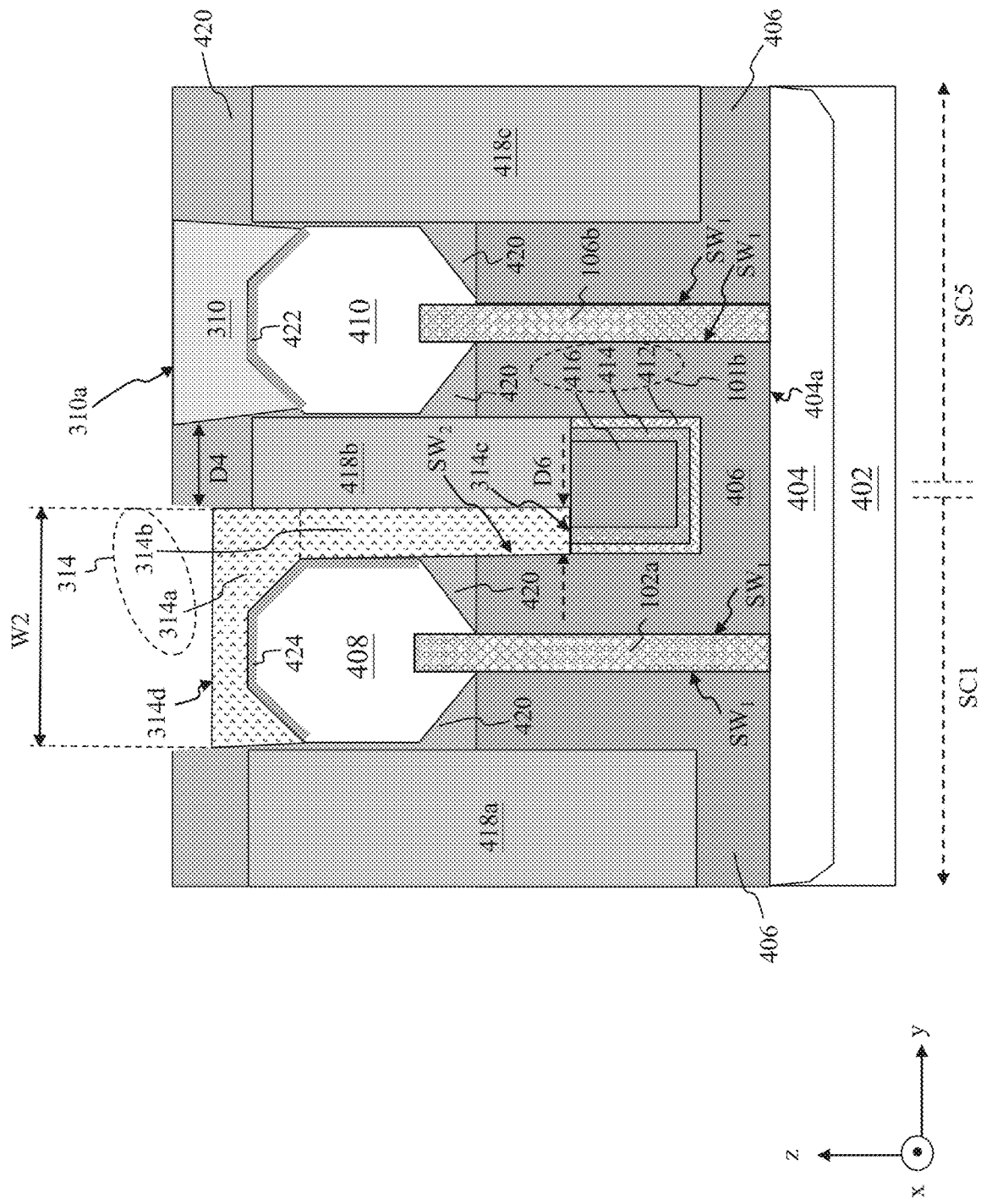
Figure 6Q:
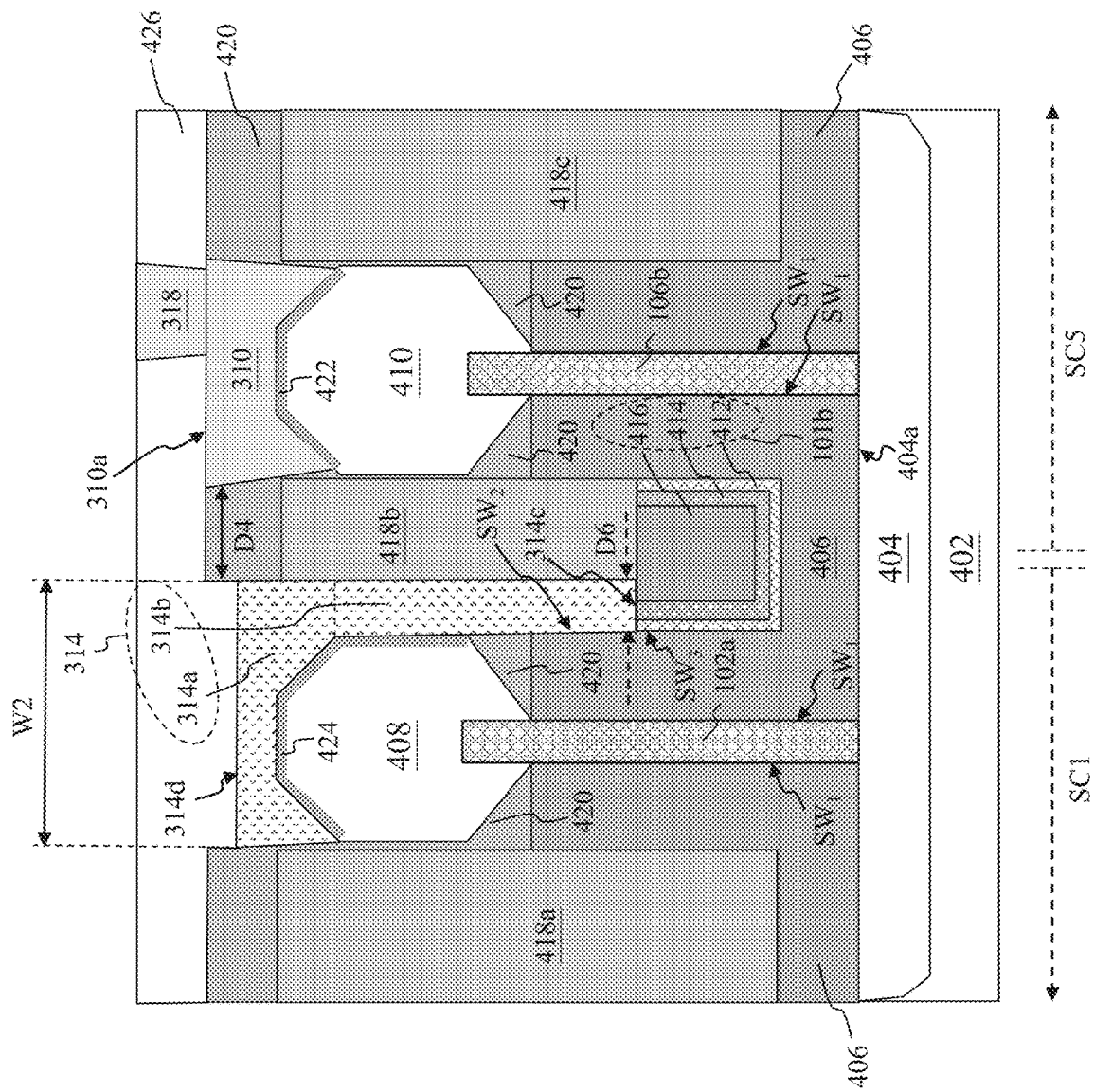

FIGS. 6A to 6Q illustrate a method of forming the features shown in FIG. 4, in accordance with an embodiment. FIG. 6A shows fin structures 102a, 106b (having an N-type conductivity) protruding from the major surface 404a of the P-type well region 404 in the third direction. The P-type well region 404 and fin structures 102a, 106b may be formed by any suitable process. For example, in some embodiments, a combination of deposition, lithography, etching, and/or implantation processes are performed to define these features. Similar processes may be used to form the N-type well regions, the fin structures 102b, 104a, 104b, 106a, and the other P-type well regions shown in FIG. 2. For example, an embodiment process for forming the P-type well regions, N-type well regions, and fin structures includes forming trenches in the substrate 402 to define semiconductor strips, and subsequently performing a plurality of doping processes to define the P-type well regions, the N-type well regions, the fin structures 106b, 102a, and 104b in the P-type well regions, and the fin structures 106a, 102b, 104a in the N-type well regions. As an example, the lithography process used to form trenches in the substrate 402 can include forming a resist layer on the substrate 402 (for example, by spin coating), performing a pre-exposure baking process, performing an exposure process using a mask, performing a post-exposure baking process, and performing a developing process. During the exposure process, the resist layer is exposed to radiation energy (for example, ultraviolet (UV) light, deep UV (DUV) light, or extreme UV (EUV) light). The mask blocks, transmits, and/or reflects radiation to the resist layer depending on a mask pattern of the mask and/or mask type (for example, binary mask, phase shift mask, or EUV mask), such that an image is projected onto the resist layer that corresponds with the mask pattern. Since the resist layer is sensitive to radiation energy, exposed portions of the resist layer chemically change, and exposed (or non-exposed) portions of the resist layer are dissolved during the developing process depending on characteristics of the resist layer and characteristics of a developing solution used in the developing process. After development, the patterned resist layer includes a resist pattern that corresponds with the mask.

The etching process that follows the lithography process uses the patterned resist layer as an etch mask to remove portions of the substrate 402 that are exposed. The etching process can include a dry etching process (for example, an RIE process), a wet etching process, other suitable etching process, or combinations thereof. After the etching process, the patterned resist layer is removed from the substrate 402, for example, by a resist stripping process, thereby defining semiconductor strips extending out of the substrate 402.

The above-described process of forming the semiconductor strips and trenches in the substrate 402 is one of other suitable processes. For example, in other embodiments, the semiconductor strips may be formed from the substrate 402 by a multiple patterning process, such as a double patterning lithography (DPL) process (for example, a lithography-etch-lithography-etch (LELE) process, a self-aligned double patterning (SADP) process, a spacer-is-dielectric (SID) SADP process, other double patterning process, or combinations thereof), a triple patterning process (for example, a lithography-etch-lithography-etch-lithography-etch (LELELE) process, a self-aligned triple patterning (SATP) process, other triple patterning process, or combinations thereof), other multiple patterning process (for example, self-aligned quadruple patterning (SAQP) process), or combinations thereof. Additionally or alternatively, directed self-assembly (DSA) techniques are implemented while forming the semiconductor strips from the substrate 402. Further, in some embodiments, the exposure process can implement maskless lithography, electron-beam (e-beam) writing, ion-beam writing, and/or nanoimprint technology for patterning the resist layer and/or other layers.

Subsequent to forming the semiconductor strips in the substrate 402, the plurality of doping processes are performed to appropriately dope regions of the substrate 402 and the semiconductor strips to define the P-type well regions, the N-type well regions, the fin structures 106b, 102a, and 104b in the P-type well regions, and the fin structures 106a, 102b, 104a in the N-type well regions. The plurality of doping process may include an ion implantation process and/or a diffusion process.

Referring to FIG. 6B, the first dielectric layer 406 is deposited on the major surface 404a of the P-type well region 404 with a conformal profile, covering the fin structures 102a, 106b. The first dielectric layer 406 may be deposited by any suitable technique including thermal growth, CVD, high-density plasma CVD (HDP-CVD), PVD, ALD, and/or spin-on techniques. As a result of the conformal profile of the first dielectric layer 406, trenches 602a, 602b, 602c are defined by the first dielectric layer 406.

Referring to FIG. 6C, a patterned resist layer 604 is formed by a lithography-and-patterning process. The patterned resist layer 604 fills the trenches 602a and 602c and overlies portions of the first dielectric layer 406 disposed over the fin structures 102a, 106b. However, the trench 602b is exposed (e.g. by an etching process conducted in conjunction with a patterning step of the lithography-and-patterning process). Referring to FIG. 6D, the power supply line 101b is formed in the trench 602b. The barrier layer 412 of the power supply line 101b may be formed using a CVD process, such as PECVD. The seed layer 414 of the power supply line 101b may be deposited by PVD, ALD, or CVD. The conductive material 416 of the power supply line 101b may be formed using any suitable deposition method, such as PVD, CVD, ALD, plating (e.g. electroplating), or a combination thereof. Referring to FIG. 6E, following formation of the power supply line 101b, the patterned resist layer 604 is removed using, for example, wet stripping or plasma ashing.

Referring to FIG. 6F, the trenches 602a, 602b, 602c are filled with a dielectric material 606 that is different from the material the first dielectric layer 406. The dielectric material 606 also overlies portions of the first dielectric layer 406 disposed over the fin structures 102a, 106b. The dielectric material 606 includes one or more of the materials described above in reference to fill fins 418a, 418b, 418c. In a later step, the dielectric material 604 is patterned to form the fill fins 418a, 418b, 418c. The dielectric material 604 may be formed by ALD, flowable CVD (FCVD), spin-on coating, or a combination thereof. A polishing process, such as a chemical mechanic polishing (CMP) process, is performed to planarize the top surfaces of the dielectric material 606 and the first dielectric layer 406, thereby exposing top surfaces of the fin structures 102a, 106b, as shown in FIG. 6G. In essence, the polishing process removes excessive portions of the dielectric material 606 and the first dielectric layer 406 from the fin structures 102a, 106b.

Referring to FIG. 6H, the first dielectric layer 406 is selectively recessed using, for example, dry etching, wet etching, RIE, and/or other suitable etching methods. The selective recessing of the first dielectric layer 406 is accomplished because of the difference in the etch rates of the material of the first dielectric layer 406 and the material of the dielectric material 606. The selective recessing of the first dielectric layer 406 defines the fill fins 418a, 418b, 418c. In some embodiments, such as in the example of FIG. 6H, the fin structures 102a, 106b may also be subjected to etching, thereby reducing a height of the fin structures 102a, 106b, as measured in the third direction (e.g. the z-direction). It is noted that even though the height of the fin structures 102a, 106b may be reduced, a top surface 605 of the power supply line 101b is still recessed in comparison to top surfaces 603 of the fin structures 102a, 106b. The etching chemistries can include a fluorine-based fluid.

Referring to FIG. 6I, the source epitaxial feature 408 and drain epitaxial feature 410 are formed over the fin structures 102a and 106b, respectively. In some embodiments, such as in the example of FIG. 6I, the fill fins 418a, 418b, 418c may serve to self-align the epitaxial drain feature 410 and the epitaxial source feature 408 to the drain region of the fin structure 106b and the source region of the fin structure 102a, respectively. An epitaxy process used to form the epitaxial features 408 and 410 may include CVD deposition techniques (for example, vapor-phase epitaxy (VPE), ultra-high vacuum CVD (UHV-CVD), LPCVD, and/or PECVD), molecular beam epitaxy, other suitable SEG processes, or combinations thereof. The epitaxy process can use gaseous and/or liquid precursors. In the example of FIG. 6I, the epitaxial features 408 and 410 are doped with N-type dopants. It is noted, however, that epitaxial features disposed in N-type well regions of the integrated circuit device 100 are doped with P-type dopants. The N-type epitaxial features 408 and 410 includes epitaxial layers including silicon and/or carbon, where silicon-containing epitaxial layers or silicon-carbon-containing epitaxial layers are doped with phosphorous, arsenic, other N-type dopants, or combinations thereof (for example, forming a Si:P epitaxial layer, a Si:C epitaxial layer, a Si:C:P epitaxial layer, a Si:As epitaxial layer, or combinations thereof). On the other hand, the P-type epitaxial features of the integrated circuit 100 includes epitaxial layers including silicon and/or germanium, where the silicon germanium containing epitaxial layers are doped with boron, carbon, other P-type dopants, or combinations thereof (for example, forming a Si:Ge:B epitaxial layer or a Si:Ge:C epitaxial layer).

Referring to FIG. 6J, the second dielectric layer 420 (e.g. ILD layer) is formed over the epitaxial features 408, 410 and fills the spaces between the epitaxial features 408, 410 and the first dielectric layer 406 as well as the spaces between the epitaxial features 408, 410 and the fill fins 418a, 418b, 418c. The second dielectric layer 420 additionally overlies the fill fins 418a, 418b, 418c and the epitaxial features 408, 410. The second dielectric layer 420 may be formed using a suitable deposition process, for example, a PECVD process, an FCVD process, or other suitable deposition technique.

Referring to FIG. 6K, a lithography and etching process is performed to form a trench 608 (e.g. a slot opening) that exposes a portion of the epitaxial source feature 408 and a portion of the power supply line 101b. The etch process may be an anisotropic etch process that is tuned to selectively remove material of the second dielectric layer 420 and material of the fill fin 418b without etching the epitaxial source feature 408. This may be accomplished by an anisotropic dry etching process that uses a proper etching gas, such as fluorine-containing or chlorine-containing gas. As seen in FIG. 6K, a portion of the fill fin 418b proximate the epitaxial source feature 408 is removed in this step. It is noted that the epitaxial source feature 408 may function as an etch stop feature during the formation of the trench 608, with one side of the trench being aligned to a fill fin (e.g. the fill fin 418a).

Referring to FIG. 6L, the source silicide layer 424 is formed by initially depositing a metal layer over the epitaxial source feature 408. The integrated circuit device 100 is then heated (for example, subjected to an annealing process) to cause constituents of epitaxial source feature 408 (for example, silicon and/or germanium) to react with the metal. Any un-reacted metal, such as remaining portions of the metal layer, is selectively removed by any suitable process, such as an etching process.

Referring to FIG. 6M, the source contact 314 is formed in the trench 608 using, for example a deposition process. The barrier layer 502 of the source contact 314 may be formed using a CVD process, such as PECVD. The seed layer 504 of the source contact 314 may be deposited by PVD, ALD, or CVD. The conductive material 506 of the source contact 314 may be formed using any suitable deposition method, such as PVD, CVD, ALD, plating (e.g. electroplating), or a combination thereof. In some embodiments, the source contact 314 is etched back (e.g. such that its top surface is recessed in comparison to a top surface of the second dielectric layer 420) in order to reduce source contact to poly capacitance.

Referring to FIG. 6N, a lithography and etching process is performed to form an opening 610 that exposes one or more surfaces of the epitaxial drain feature 410 using, for example, dry etching, wet etching, RIE, and/or other suitable etching methods. As shown in FIG. 6O, the drain silicide layer 422 is formed on exposed surfaces of the epitaxial drain feature 410 using similar processes discussed above in reference to source silicide layer 424.

Referring to FIG. 6P, the drain contact 310 is formed in the opening 610 using, for example, suitable deposition processes described above in reference to forming the source contact 314. At this point, it is noted that this disclosure proposes forming the drain contact 310 and the source contact 314 in separate steps, instead of a typical lithography and etching process that includes initially forming a single continuous conductive structure in an opening and subsequently etching, cutting, or removing a central portion of the single continuous conductive structure, thereby resulting in the source contact 314 and the drain contact 310 having a separation of dimension D4. An effect of this is that the proposed method has less constrained critical dimension requirements and process windows requirements in comparison to the typical lithography and etching process described above. For example, instead of forming a cut window having an opening of dimension D4 (which is less than 12 nanometers), the proposed method allows for a process window having an opening of dimension W2 (which is in a range from about 15 nanometers to about 40 nanometers), thereby decreasing the possibility of failure in the lithography and etching processes used to form the source contact 314 and the drain contact 310.

Referring to FIG. 6Q, the etch stop layer 426 is formed over the second dielectric layer 420 and over the source and drain contacts 314, 310 using a suitable deposition process, for example, a PECVD process, an FCVD process, or other suitable deposition technique. The via structure 318 is formed in the etch stop layer 426 to contact the surface 310a of the drain contact 310. The via structure 318 may be formed by lithography and etching process that initially forms an opening in the etch stop layer 426 and by a suitable deposition process that fills the opening in the etch stop layer 426 with a conductive material. Suitable deposition processes include PVD, CVD, ALD, plating (e.g. electroplating), or a combination thereof. It is noted that the sequence of steps discussed above in reference to FIGS. 6A to 6Q is not meant to be limiting as the sequence may be different in other embodiment methods. For example, in some embodiments, the epitaxial source and drain features 408, 410 may be formed prior to the forming of the power supply line 101b.

Figure 7:
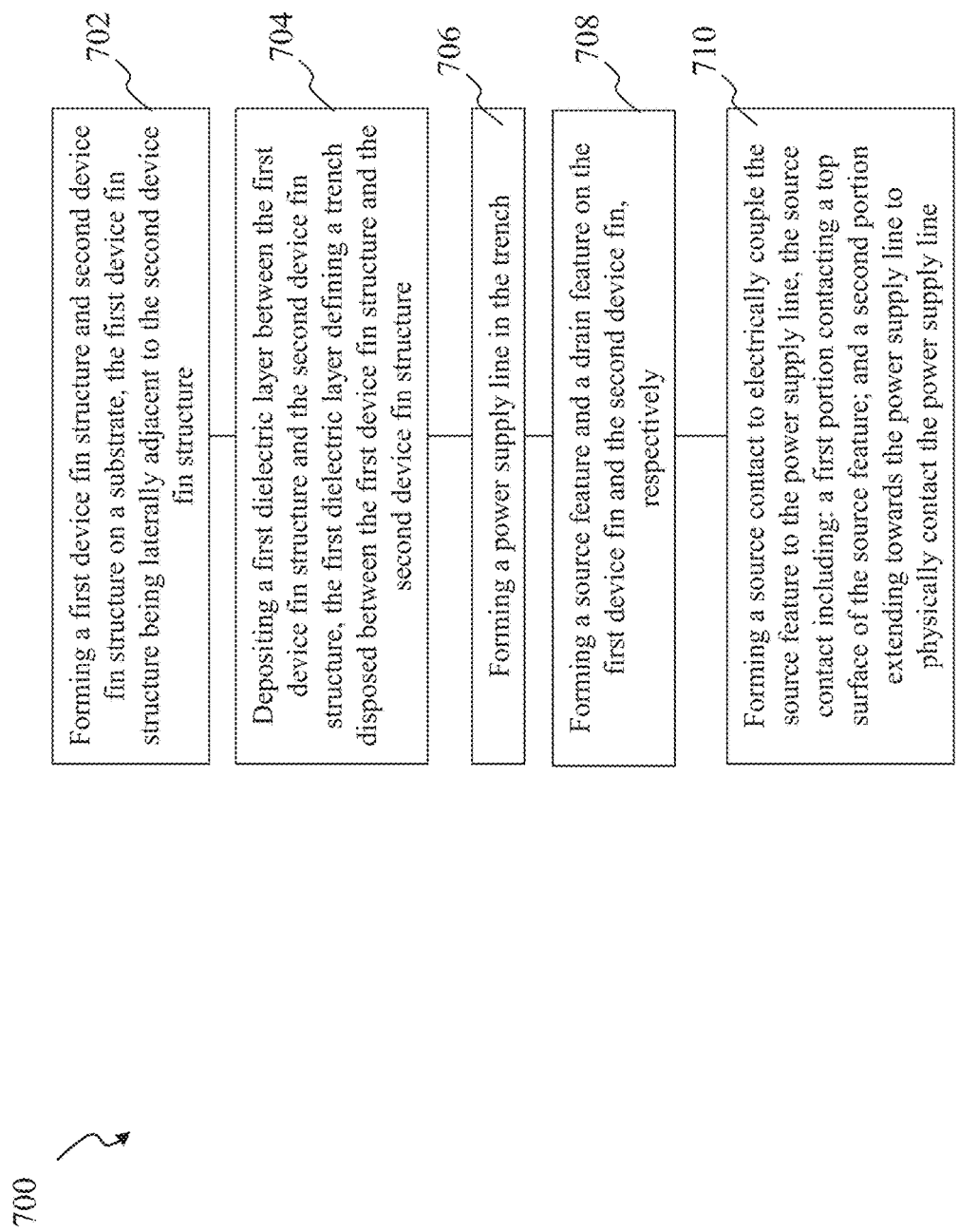
FIG. 7 shows a flow chart describing a method for forming transistor devices of the array of standard cells of FIG. 1, in accordance with an embodiment.

FIG. 7 shows a flow chart illustrating a method 700 for forming transistor devices of the array of standard cells of FIG. 1, in accordance with an embodiment. The method 700 includes operation 702 of forming a first device fin structure and second device fin structure on a substrate, the first device fin structure being laterally adjacent to the second device fin structure. The operation 702 may, as an example, include the steps discussed above in reference to FIG. 6A. The method 700 includes operation 704 of depositing a first dielectric layer between the first device fin structure and the second device fin structure, the first dielectric layer defining a trench disposed between the first device fin structure and the second device fin structure. The operation 704 may, as an example, include the steps discussed above in reference to FIG. 6B. The method 700 includes operation 706 of forming a power supply line in the trench. The operation 706 may, as an example include the steps discussed above in reference to FIGS. 6C to 6E. The method 700 includes operation 708 of forming a source feature and a drain feature on the first device fin and the second device fin, respectively. The operation 706 may, as an example, include the steps discussed above in reference to FIGS. 6F to 6I. The method 700 includes operation 710 of forming a source contact to electrically couple the source feature to the power supply line, the source contact including: a first portion contacting a top surface of the source feature; and a second portion extending towards the power supply line to physically contact the power supply line. The operation 706 may, as an example, include the steps discussed above in reference to FIGS. 6J to 6M.

In summary, the present disclosure proposes structural features for the source contacts of the standard cells of the integrated circuit device 100 that result in a decrease in parasitic capacitance between a source contact and an adjacent drain contact, even as technology progresses towards smaller technology nodes. The structural features of the source contacts of the standard cells of the integrated circuit device 100 also lead to a decrease in a contact resistance between a respective source contact and a respective power supply line to which the respective source contact is coupled. The decrease in parasitic capacitance and the decrease in contact resistance also lead to an increase in an operating speed of the standard cells of the integrated circuit device 100. Furthermore, the present disclosure presents one or more embodiment methods that may be used to form the embodiment source contacts. The one or more embodiment methods have less constrained critical dimension requirements and process windows requirements in comparison to the typical lithography and etching process described above.

An embodiment device includes: a first semiconductor strip extending longitudinally in a first direction; and a second semiconductor strip extending longitudinally in the first direction, the first semiconductor strip and the second semiconductor strip being spaced apart from each other in a second direction, the second direction being perpendicular to the first direction. The device further includes a power supply line located between the first semiconductor strip and the second semiconductor strip in the second direction, wherein a top surface of the power supply line is recessed in comparison to a top surface of the first semiconductor strip; a source feature disposed on a source region of the first semiconductor strip; and a source contact electrically coupling the source feature to the power supply line. The source contact includes: a lateral portion contacting a top surface of the source feature; and a vertical portion extending along a sidewall of the source feature towards the power supply line to physically contact the power supply line.

An embodiment method includes: forming a first device fin structure and a second device fin structure on a substrate, the first device fin structure being laterally adjacent to the second device fin structure; and depositing a first dielectric layer on the first device fin structure and the second device fin structure, the first dielectric layer defining a trench disposed between the first device fin structure and the second device fin structure. The method additionally includes forming a power supply line in the trench; forming a source feature and a drain feature on the first device fin structure and the second device fin structure, respectively; and forming a source contact to couple the source feature to the power supply line. The source contact includes a first portion contacting a top surface of the source feature; and a second portion extending from a peripheral region of the first portion towards the power supply line to physically contact the power supply line.

An embodiment device includes: a well region; a first transistor device disposed within a boundary of the well region, the first transistor device including a first fin structure extending lengthwise in a first direction; a second transistor device disposed within the boundary of the well region, the second transistor device including a second fin structure extending lengthwise in the first direction, the first transistor device being spaced apart from the second transistor device in a second direction, the second direction being perpendicular to the first direction. The device also includes an insulating region disposed between the first fin structure and the second fin structure in the second direction; a power supply line disposed within the insulating region, wherein the power supply line is recessed, in a third direction, in comparison to a source feature of the first transistor device, the third direction being perpendicular to the first direction and the second direction; and a source contact coupling the source feature of the first transistor device to the power supply line. The source contact includes a first portion disposed on a surface of the source feature directed away from the well region; and a second portion extending continuously from the first portion in the third direction to physically contact the power supply line.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
   a first semiconductor strip extending longitudinally in a first direction;
   a second semiconductor strip extending longitudinally in the first direction, the first semiconductor strip and the second semiconductor strip being spaced apart from each other in a second direction, the second direction being perpendicular to the first direction;
   a power supply line located between the first semiconductor strip and the second semiconductor strip in the second direction, wherein a top surface of the power supply line is recessed in comparison to a top surface of the first semiconductor strip;
   a source feature disposed on a source region of the first semiconductor strip; and
   a source contact electrically coupling the source feature to the power supply line, the source contact including:
      a lateral portion contacting a top surface of the source feature; and
      a vertical portion extending along a sidewall of the source feature towards the power supply line to physically contact the power supply line.

2. The device of claim 1, wherein a dimension of a surface of the vertical portion of the source contact that physically contacts the power supply line is greater than 12 nanometers in the second direction.

3. The device of claim 1, wherein a dimension of the lateral portion of the source contact is in a range from about 8 nanometers to about 15 nanometers in the first direction.

4. The device of claim 1, wherein a dimension of the lateral portion of the source contact is in a range from about 15 nanometers to about 40 nanometers in the second direction.

5. The device of claim 1, further comprising:
   a drain feature disposed on a drain region of the second semiconductor strip; and
   a drain contact disposed on a top surface of the drain feature, wherein a top surface of the source contact is recessed in comparison with a top surface of the drain contact.

6. The device of claim 1, further comprising a first dielectric layer, the first dielectric layer lining sidewalls of the first semiconductor strip and the second semiconductor strip, the first dielectric layer further lining sidewalls of the power supply line.

7. The device of claim 6, further comprising a dielectric fin disposed on the power supply line.

8. The device of claim 7, wherein a material of the dielectric fin is different from a material of the first dielectric layer.

9. The device of claim 7, wherein the dielectric fin is adjacent to the vertical portion of the source contact in the second direction.

10. A device, comprising:
    a well region;
    a first transistor device disposed within a boundary of the well region, the first transistor device including a first fin structure extending lengthwise in a first direction;
    a second transistor device disposed within the boundary of the well region, the second transistor device including a second fin structure extending lengthwise in the first direction, the first transistor device being spaced apart from the second transistor device in a second direction, the second direction being perpendicular to the first direction;
    an insulating region disposed between the first fin structure and the second fin structure in the second direction;
    a power supply line disposed within the insulating region, wherein the power supply line is recessed, in a third direction, in comparison to a source feature of the first transistor device, the third direction being perpendicular to the first direction and the second direction; and
    a source contact coupling the source feature of the first transistor device to the power supply line, the source contact including:
       a first portion disposed on a surface of the source feature directed away from the well region; and
       a second portion extending continuously from the first portion in the third direction to physically contact the power supply line.

11. The device of claim 10, wherein a dimension of a surface of the second portion of the source contact that physically contacts the power supply line is greater than 12 nanometers in the second direction.

12. The device of claim 10, wherein a sidewall of the second portion of the source contact is substantially aligned with a sidewall of the power supply line.

13. The device of claim 10, further comprising a silicide layer disposed between the first portion of the source contact and the surface of the source feature directed away from the well region.

14. A semiconductor structure, comprising:
    a first dielectric layer disposed on a substrate;

a first fin structure rising above the first dielectric layer and extending lengthwise along a first direction;

a second fin structure above the first dielectric layer and extending lengthwise along the first direction;

a conductive line disposed in the first dielectric layer and between the first fin structure and the second fin structure;

a first source/drain feature disposed on the first fin structure;

a first source/drain contact disposed on the first source/drain feature and in contact with the conductive line;

a second source/drain feature disposed on the second fin structure; and a second source/drain contact disposed on the second source/drain feature and spaced apart from the conductive line, wherein a top surface of the first source/drain contact is lower than a top surface of the second source/drain contact.

15. The semiconductor structure of claim 14, further comprising:

a dielectric fin disposed on the conductive line, wherein the first source/drain contact extends an entire height of the dielectric fin.

16. The semiconductor structure of claim 15, wherein a portion of the first source/drain contact extends between the first dielectric layer and the dielectric fin.

17. The semiconductor structure of claim 15, wherein a composition of the dielectric fin is different from a composition of the first dielectric layer.

18. The semiconductor structure of claim 15, wherein a composition of the dielectric fin comprises hafnium oxide, zirconium oxide, or aluminum oxide.

19. The semiconductor structure of claim 15, further comprising:

a second dielectric layer over the dielectric fin, wherein the top surface of the second source/drain feature is coplanar with a top surface of the second dielectric layer, wherein the top surface of the first source/drain feature is below the top surface of the second dielectric layer.

20. The semiconductor structure of claim 19, further comprising:

a third dielectric layer disposed over the second dielectric layer, the first source/drain contact, and the second source/drain contact, wherein a portion of the third dielectric layer over the first source/drain contact extends into the second dielectric layer.

* * * * *